(12) United States Patent
Nakai et al.

(10) Patent No.: US 8,756,803 B2
(45) Date of Patent: Jun. 24, 2014

(54) METHOD FOR MANUFACTURING PRINTED WIRING BOARD

(75) Inventors: Toru Nakai, Ogaki (JP); Tetsuo Amano, Ogaki (JP); Yoshinori Takasaki, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 313 days.

(21) Appl. No.: 13/175,381

(22) Filed: Jul. 1, 2011

(65) Prior Publication Data

US 2012/0067632 A1 Mar. 22, 2012

Related U.S. Application Data

(60) Provisional application No. 61/385,301, filed on Sep. 22, 2010.

(51) Int. Cl.
*H05K 3/02* (2006.01)

(52) U.S. Cl.
USPC ............ 29/847; 29/830; 174/262; 219/121.71

(58) Field of Classification Search
USPC ............ 29/830, 831, 846, 852, 847; 174/255, 174/257, 260–262; 219/121.61, 121.7, 219/121.71
See application file for complete search history.

(56) References Cited

U.S. PATENT DOCUMENTS

| | | | | |
|---|---|---|---|---|
| 6,143,401 A | * | 11/2000 | Fischer et al. | 174/255 |
| 6,337,463 B1 | * | 1/2002 | Gaku et al. | 219/121.7 |
| 6,590,165 B1 | * | 7/2003 | Takada et al. | 174/262 |
| 7,230,188 B1 | * | 6/2007 | En et al. | 174/261 |

FOREIGN PATENT DOCUMENTS

JP 2001-102695 4/2001

OTHER PUBLICATIONS

U.S. Appl. No. 12/981,709, filed Dec. 30, 2010, Nakai, et al.
U.S. Appl. No. 13/150,744, filed Jun. 1, 2011, Nakai, et al.

* cited by examiner

*Primary Examiner* — Donghai D Nguyen
(74) *Attorney, Agent, or Firm* — Oblon, Spivak, McClelland, Maier & Neustadt, L.L.P.

(57) ABSTRACT

A method for manufacturing a printed wiring board including forming an insulative resin layer containing a resin and an inorganic filler, forming a conductor layer including a conductive material and having a conductor on the insulative resin layer, irradiating a laser beam upon the conductor of the conductor layer such that the conductor is sectioned or a width of the conductor is narrowed, and forming a conductive pattern on the insulative resin layer. The inorganic filler is in an amount of 30 wt. % or more of the insulative resin layer.

22 Claims, 25 Drawing Sheets

FIG.13

| Inorganic Filler | Amount (wt %) | Laser Irradiation Results |
|---|---|---|
| $SiO_2$ | 0 | Carbonized |
| | 15 | Carbonized |
| | 30 | Not Carbonized |
| | 50 | Not Carbonized |
| $CaCO_3$ | 30~50 | Not Carbonized |
| $BaSO_4$ | 30~50 | Not Carbonized |
| $Al(OH)_3$ | 30~50 | Not Carbonized |

METHOD FOR MANUFACTURING PRINTED WIRING BOARD

CROSS-REFERENCE TO RELATED APPLICATIONS

The present application claims the benefits of priority to U.S. Application No. 61/385,301, filed Sep. 22, 2010. The contents of that application are incorporated herein by reference in their entirety.

BACKGROUND OF THE INVENTION

1. Field of the Invention

The present invention relates to a printed wiring board having a conductive pattern on an insulative resin layer and to its manufacturing method.

2. Discussion of the Background

In Japanese Laid-Open Patent Publication No. 2001-102695, a method is described in which conductive film on a ceramic substrate is irradiated by a laser such as a YAG laser, an excimer laser or the like so that the conductive film is sectioned. The contents of Japanese Laid-Open Patent Publication No. 2001-102695 are incorporated herein by reference in their entirety in this application.

SUMMARY OF THE INVENTION

According to one aspect of the present invention, a method for manufacturing a printed wiring board includes forming an insulative resin layer containing a resin and an inorganic filler, forming a conductor layer including a conductive material and having a conductor on the insulative resin layer, irradiating a laser beam upon the conductor of the conductor layer such that the conductor is sectioned or a width of the conductor is narrowed, and forming a conductive pattern on the insulative resin layer. The inorganic filler is in an amount of 30 wt. % or more of the insulative resin layer.

According to another aspect of the present invention, a printed wiring board includes an insulative resin layer containing a resin and an inorganic filler, the inorganic filler being in an amount of 30 wt. % or more of the insulative resin layer, and a conductor layer formed on the resin insulation layer and having a conductive pattern, the conductive pattern of the conductor layer having a conductor which is sectioned or narrowed by irradiating a laser beam.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 13 is a table showing the results after a green laser is irradiated at insulation layers respectively containing four different types of inorganic fillers;

DETAILED DESCRIPTION OF THE EMBODIMENTS

Figure 1A:
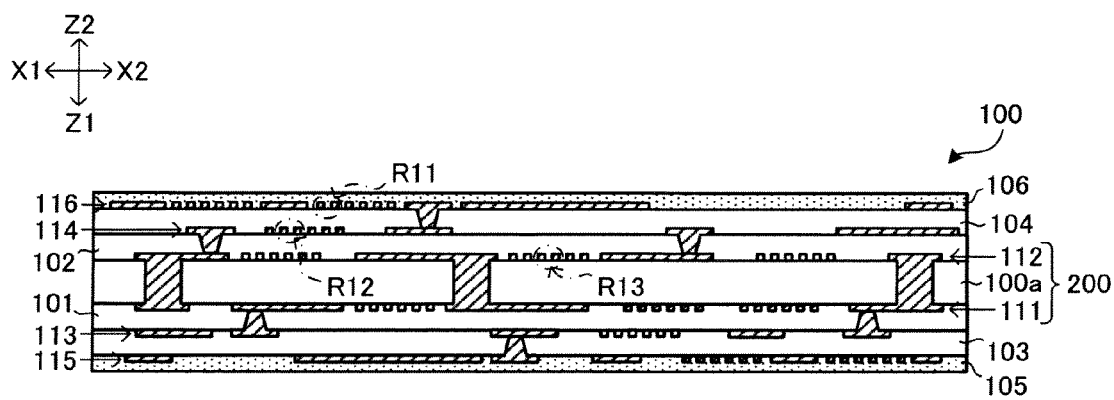
FIG. 1A is a view showing a first example of the printed wiring board manufactured by a method for manufacturing a printed wiring board according to the first embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Side surfaces of a wiring board are on the X-Z plane or the Y-Z plane.

In the present embodiment, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or inner-layer side), and the side farther from the core is referred to as an upper layer (or outer-layer side).

Conductive pattern indicates a conductor having any type of pattern (conductive layer): It may include wiring that forms a conductive circuit (including ground), pads or lands, etc.; or it may be a plain pattern that does not form a conductive circuit. Also, in a wiring board with a built-in electronic component or wiring board, electrodes of the electronic component or pads of another wiring board are included in a conductive pattern. Insulation layer indicates an interlayer insulation layer, solder resist or the like.

Plating indicates depositing a layer of conductor (such as metal) on surfaces of metal, resin or the like as well as the deposited conductive layer (such as a metal layer). Plating includes wet plating such as electrolytic plating and electroless plating as well as dry plating such as PVD (physical vapor deposition) and CVD (chemical vapor deposition).

Laser beam is not limited to visible light. In addition to visible light, laser beam includes electromagnetic waves with a short wavelength such as ultraviolet rays and X-rays as well as electromagnetic waves with a long wavelength such as infrared light. The absorption rate of laser beam in each material is the value as measured by a spectrophotometer.

Regarding line patterns formed on a surface (wiring on a surface or a groove under the surface), among the directions which intersect a line at a right angle, the measurement in a direction parallel to the surface on which the line is formed is referred to as the "width" and the measurement in a direction perpendicular to the surface on which the line is formed is referred to as "height" or "thickness" or "depth." In addition, the measurement from one end to the other end of the line is referred to as "length." However, those measurements are not limited to the above if clearly defined otherwise.

First Embodiment

Wiring board 100 manufactured in the present embodiment is a multilayer printed wiring board (double-sided rigid wiring board) as shown in FIG. 1A, for example.

Wiring board 100 has substrate 200 (core substrate), insulation layers (101~104) (interlayer insulation layers), solder resist (105, 106) and conductive patterns (113~116). Substrate 200 has insulation layer (100a) and conductive patterns (111, 112). In the present embodiment, conductive patterns (111~116) each function as a conductive circuit. Also, conductive patterns are electrically connected to each other by conductors (such as via conductors or through-hole conductors) in holes formed in interlayer insulation layers. By mounting another wiring board and electronic component or the like on one surface or both surfaces of wiring board 100, wiring board 100 may be used as a circuit board for a cell phone, for example.

Wiring board 100 is manufactured, for example, by alternately building up insulation layers (101~104) and conductive patterns (113~116) on substrate 200, and then by forming solder resists (105, 106) on the outermost layers.

The patterning method shown in later-described FIGS. 6A~10B may be applied for outer-layer conductive pattern 116 (region R11) or for inner-layer conductive pattern 114 (region R12). It may further be applied for conductive pattern 112 (region R13) on the core substrate.

Substrate 200 is manufactured, for example, by the steps shown in later-described FIGS. 3~10B. Alternatively, a double-sided copper-clad laminate may be used as substrate 200. Insulation layers (101~104) are formed (laminated), for example, by vacuum lamination using resin film (semi-cured adhesive sheet). Insulation layers (101~104) and conductive patterns (113~116) are manufactured, for example, by the steps shown in later-described FIGS. 3~10B. Alternatively, conductive patterns (113~116) may be formed by using any one of the following methods or any combination of two or more of those: panel plating method, pattern plating method, full-additive method, semi-additive (SAP) method, subtractive method and tenting method. Solder resists (105, 106) are formed, for example, by screen printing, spray coating, roll coating, lamination or the like.

Figure 1B:
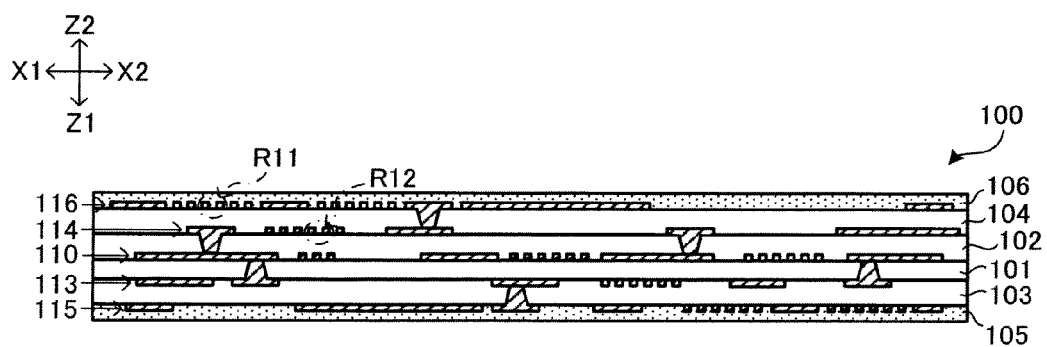
FIG. 1B is a view showing a second example of the printed wiring board manufactured by a method for manufacturing a printed wiring board according to the first embodiment of the present invention.

Also, by a method for manufacturing a printed wiring board according to the present embodiment, a multilayer printed wiring board (double-sided rigid wiring board) without substrate 200 (core substrate) shown in FIG. 1B may also be manufactured. In an example in FIG. 1B, using conductive pattern 110 as a base (core position), two insulation layers (101, 103) and two conductive patterns (113, 115) are alternately laminated on the first-surface side, and two insulation layers (102, 104) and two conductive patterns (114, 116) are alternately laminated on the second-surface side. Then, the outermost layer on the first-surface side (insulation layer 103 and conductive pattern 115) is coated with solder resist 105, and the outermost layer on the second-surface side (insulation layer 104 and conductive pattern 116) is coated with solder resist 106.

Figure 2:
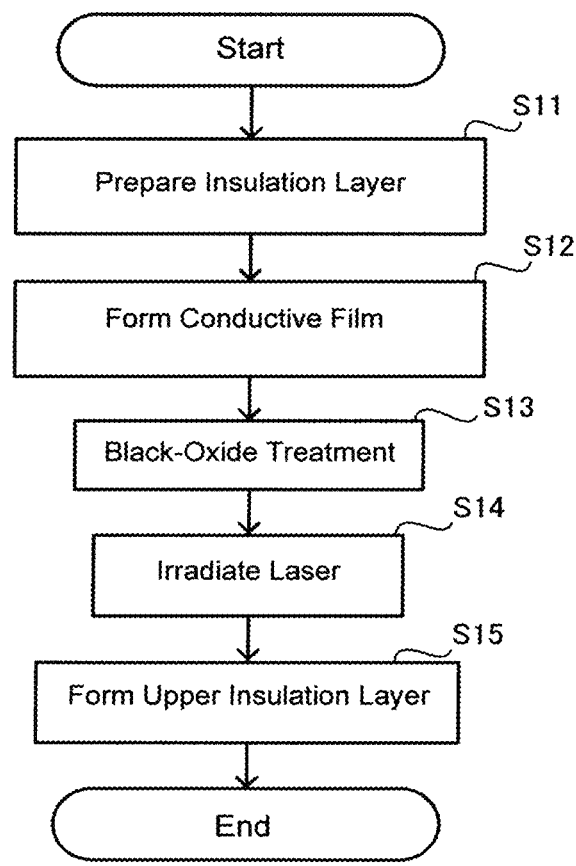
FIG. 2 is a flowchart showing a method for manufacturing a printed wiring board according to the first embodiment of the present invention.

The above wiring board 100, especially the structure shown in regions (R11~R13) (FIGS. 1A, 1B), is manufactured by a method shown in FIG. 2, for example.

Figure 3:
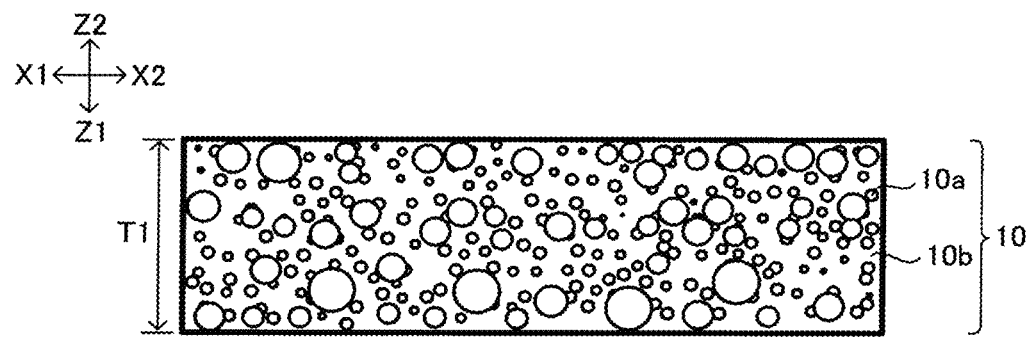
FIG. 3 is a view to illustrate a step for preparing an insulation layer.

As shown in FIG. 3, insulation layer 10 is prepared in step (S11). Insulation layer 10 is an insulative resin layer.

Here, insulation layer 10 contains filler (10a) and resin (10b). Insulation layer 10 is formed by blending filler (10a) with resin (10b). In the present embodiment, filler (10a) is dispersed almost uniformly in substantially the entire insulation layer 10. However, forming insulation layer 10 is not limited to such, and filler (10a) may also be embedded only in the surface-layer portion of insulation layer 10 (see later-described FIG. 30).

In the present embodiment, resin (10b) is made of insulative resin. This insulative resin is preferred to be thermosetting resin. In the present embodiment, resin (10b) is made of epoxy resin. Epoxy resin is thermosetting resin. As for thermosetting resin, other than epoxy resin, the following resins may also be used: phenol rein, polyphenylene ether (PPE), polyphenylene oxide (PPO), fluororesin, LCP (liquid crystal polymer), polyester resin, imide resin (polyimide), BT resin, allyl polyphenylene ether resin (A-PPE resin), aramid resin and the like.

Insulation layer 10 is preferred to contain filler (10a) at 30 wt. %,or more; especially it is more preferred to contain filler (10a) at 50 wt. % or more.

In the present embodiment, filler (10a) is made of inorganic filler. Thus, since inorganic filler widely used as insulative material for printed wiring boards may be used as is, it is advantageous in terms of cost and quality control.

Inorganic filler is preferred to be a white filler, for example. The inorganic filler of the present embodiment is a silica-type filler. As for silica-type fillers, silicate minerals should preferably be used; especially at least any one of silica, mica, talc, kaolin and calcium silicate is preferred to be used. Also, as for silica, at least any one from among spherical silica, crushed silica, fused silica and crystalline silica is preferred to be used. However, white filler is not limited to the above. As for white fillers, filler made of calcium carbonate (hereinafter referred to as calcium-carbonate filler), filler made of barium sulfate (hereinafter referred to as barium-sulfate filler) and filler made of aluminum hydroxide (hereinafter referred to as aluminum-hydroxide filler) are also effective. Also, two or more white fillers selected from among the above silica-type fillers, calcium-carbonate filler, barium-sulfate filler and aluminum-hydroxide filler may be contained in insulation layer 10. Especially, if insulation layer 10 contains at least one from among calcium-carbonate filler, barium-sulfate filler and aluminum-hydroxide filler in addition to a silica filler, it is considered to be effective in reducing costs.

The average particle diameter of filler (10a) is preferred to be 0.5 μm or greater but 10 μm or smaller. If the average diameter of filler (10a) is in the above range, filler (10a) functions appropriately as a stopper to prevent the insulation layer from being damaged by laser energy. Other than inorganic filler, the same effect may be achieved from fibrous inorganic materials.

In the present embodiment, more than 50 wt. % of filler (10a) is spherical filler (spherical silica). If the primary ingredient (more than half) of filler (10a) is spherical filler, filler (10a) functions appropriately as a stopper during the later-described laser irradiation process (see FIG. 9). In addition, as a result, a conductor, catalyst or the like seldom remains on insulation layer 10. However, the material or the like of filler (10a) is not limited specifically. For example, filler (10a) is not always required to contain spherical filler.

Thickness (T1) of insulation layer 10 is preferred to be in the range of 5~200 μm. If thickness (T1) is in this range, there are such advantages that insulation layer 10 does not have to be thicker than necessary for its insulation reliability to be ensured.

Figure 4:
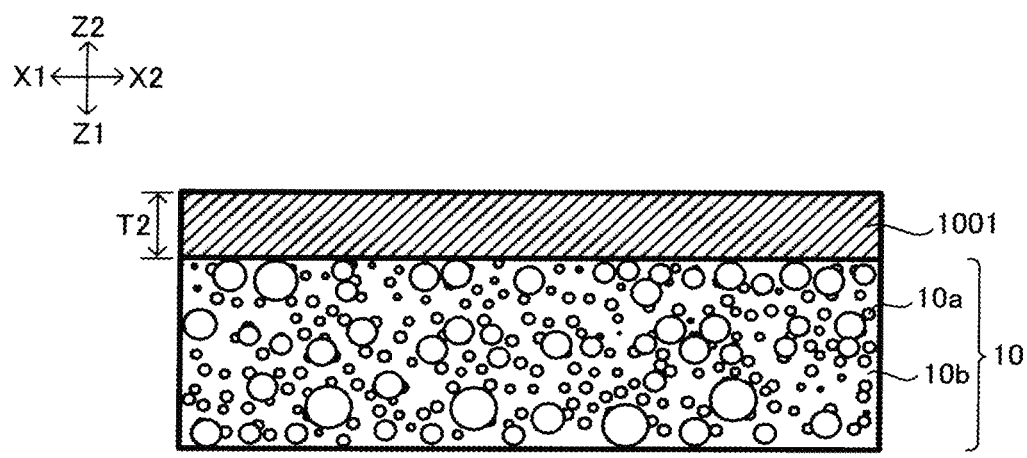
FIG. 4 is a view to illustrate a step for forming a conductive film on the insulation layer.

In step (S12) of FIG. 2, copper foil 1001 is formed as conductive film on insulation layer 10 by lamination, for example, as shown in FIG. 4. Thickness (T2) of copper foil 1001 is preferred to be in the range of 5~20 μm. The material for conductive film is not limited to copper, and any other material may be used.

Figure 5A:
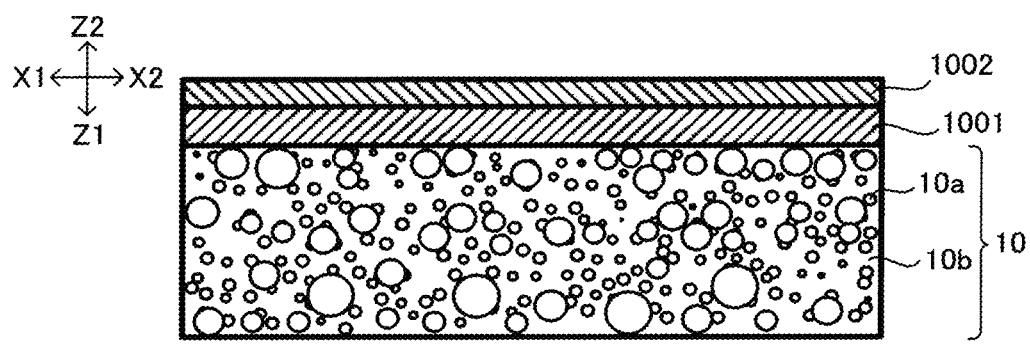
FIG. 5A is a view showing a first example of the structure of a conductive film.
Figure 5B:
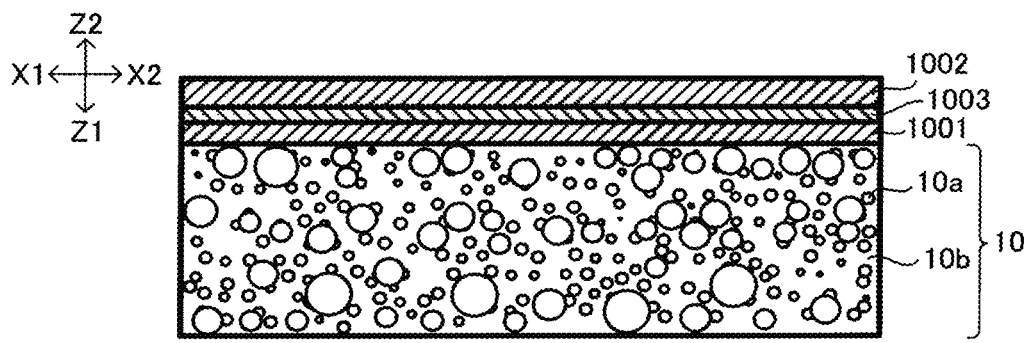
FIG. 5B is a view showing a second example of the structure of a conductive film.
Figure 5C:
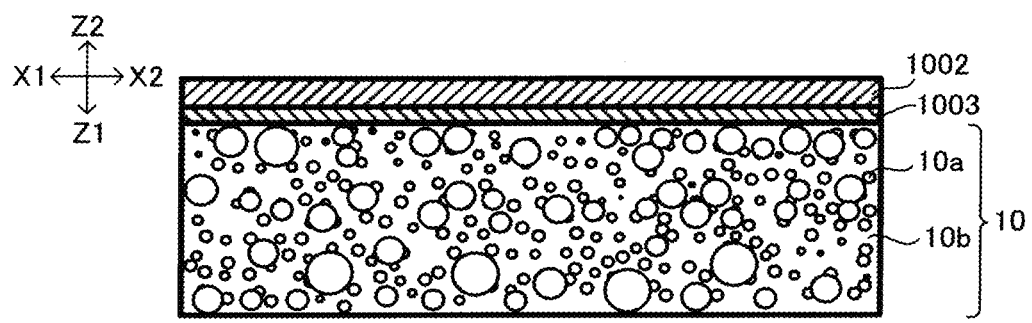
FIG. 5C is a view showing a third example of the structure of a conductive film.

Here, the structure of conductive film is not limited to a single layer of copper foil 1001 as shown previously in FIG. 4. For example, as shown in FIG. 5A, conductive film may be double-layered with copper foil 1001 and electrolytic plated film 1002 made of copper, for example, laminated on insulation layer 10 in that order. Alternatively, as shown in FIG. 5B, for example, conductive film may also be triple-layered with copper foil 1001, electroless plated film 1003 made of copper, for example, and electrolytic plated film 1002 laminated on insulation layer 10 in that order. Yet alternatively, conductive film may be formed without copper foil 1001. For example, as shown in FIG. 5C, conductive film may be double-layered with electroless plated film 1003 and electrolytic plated film 1002 laminated on insulation layer 10 in that order. The number of layers of conductive film is not limited specifically. For example, conductive film may be formed with four or more layers. Basically, the structure of conductive film is determined freely.

In step (S13) of FIG. 2, black-oxide coating is formed on the surface (the entire surface, for example) of copper foil 1001 through black-oxide treatment, for example. In doing so, the laser absorption rate increases and laser processing efficiency improves. After laser processing, oxide remaining on the surface of copper foil 1001 is removed through acid cleaning, reduction treatment or the like, if required.

In step (S14) of FIG. 2, by irradiating a green laser at copper foil 1001, copper foil 1001 is sectioned to form a conductive pattern (conductive circuits).

Figure 6A:
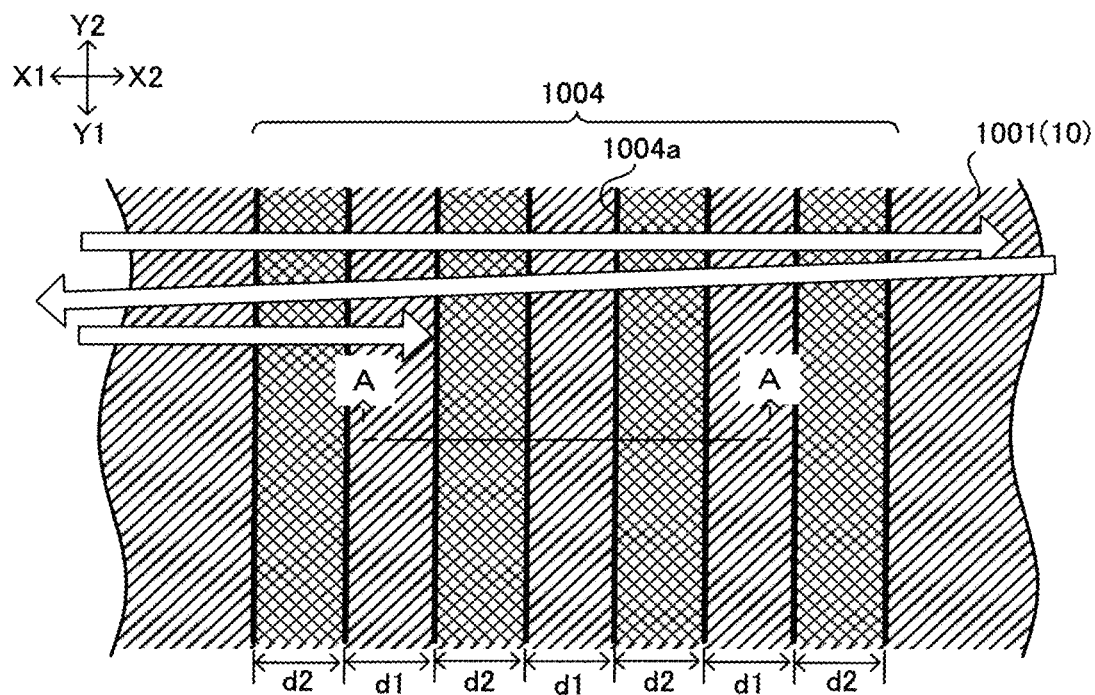
FIG. 6A is a view to illustrate a step for irradiating a laser to pattern the conductive film.
Figure 6B:
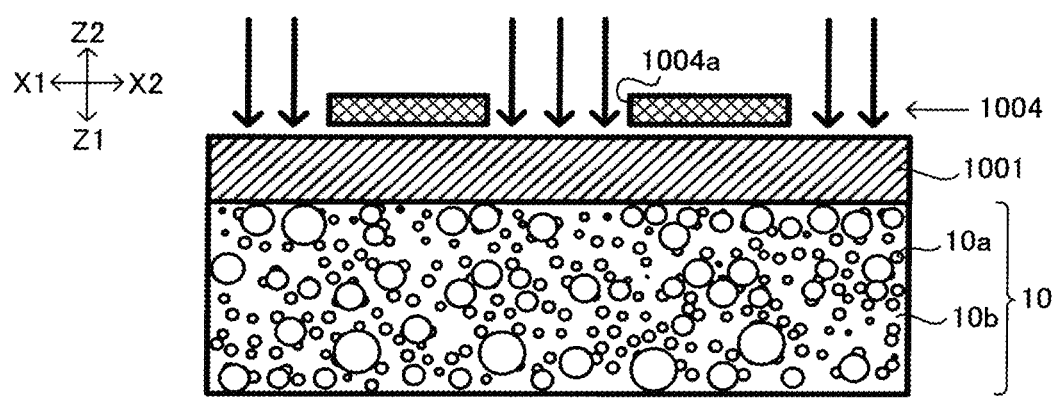
FIG. 6B is a cross-sectional view taken at the "A-A" line in FIG. 6A.

Specifically, as shown in FIG. 6A and FIG. 6B (a cross-sectional view taken at the "A-A" line in FIG. 6A), for example, it is preferred that shading mask 1004 with opening portions (1004a) be placed on the second-surface side of an object to be irradiated (such as insulation layer 10), and a green laser be irradiated on the entire surface (the entire second surface, in particular) of the object. Here, a green laser indicates the second harmonic of a fundamental wave with a wavelength of 1064 nm; namely, laser beam with a wavelength of 532 nm.

In the present embodiment, a conductive pattern with multiple straight lines positioned substantially parallel to each other is formed (see later-described FIG. 10A). Namely, as shown in FIG. 6A, shading mask 1004 has a straight-line pattern corresponding to the above. However, conductive patterns are not limited to such, and any other pattern may be employed (see later-described FIGS. 27, 28).

When such a green laser is irradiated on the entire surface of an object, it is preferred that the object be fixed and a green laser (more specifically, its aiming point) be moved. Conversely, it is preferred that a green laser be fixed (more specifically, its aiming point) and the object be moved. When moving a green laser, it is preferred that the green laser be moved (scanned) by a galvanomirror, for example. When moving an object, a green laser is set to be a line beam using a cylindrical lens, for example, which is then irradiated at predetermined portions while the object is moved by a conveyor. In addition, to prevent drift (plume) of the conductive material during laser irradiation from cooling and attaching again on the conductive pattern, it is effective to employ non-thermal processing using a laser with an extremely short pulse on the order of picoseconds or femtoseconds, or laser irradiation carried out while the irradiation areas are in contact with a liquid such as water, or a combination of those.

Laser intensity (the amount of light) is preferred to be adjusted by pulse control. Specifically, for example, to modify laser intensity, the number of shots (irradiation number) is changed without changing laser intensity per shot (one irradiation). Namely, if required laser intensity is not obtained with one shot, laser beam is irradiated again at the same irradiation spot. If such a control method is used, the throughput improves since time for modifying irradiation conditions is omitted. However, adjusting laser intensity is not limited to the above, and any other method may be taken. For example, irradiation conditions may be determined for each irradiation spot, while the irradiation number is set constant (for example, one shot per one irradiation spot). Also, if multiple laser shots are irradiated at the same irradiation spot, the laser intensity may be modified for each shot. Moreover, copper foil 1001 may be patterned using a laser beam that is out of focus in a direction Z so that the aiming point does not completely correspond to the targeted spot. If an out-of-focus beam is used, its spot diameter is enlarged while the laser intensity is weakened, enabling soft-touch processing.

Figure 7:
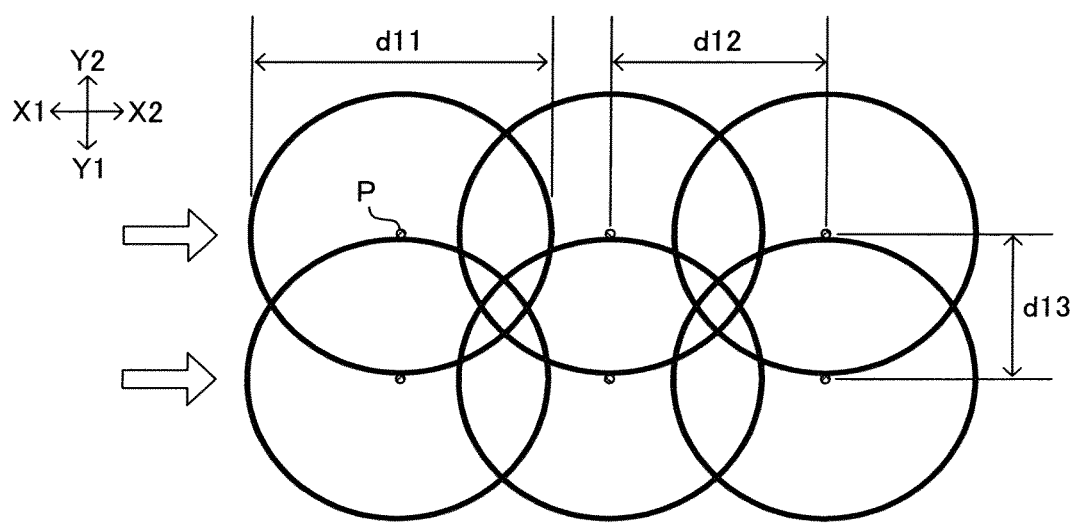
FIG. 7 is a view to illustrate an example of conditions for how to move a laser (more specifically, its aiming point)

Here, an example of the conditions is shown for moving a green laser using a galvanomirror. In FIG. 7, spot diameter (d11) of laser beam is 30 μm, for example. In this example, the scanning direction of laser beam is set along a direction X. Unit moving amount (d12) along a direction X (distance between irradiation centers P of adjacent spots) is 20 μm, for example. Also, unit moving amount (d13) along a direction Y (distance between irradiation centers P of adjacent spots) is 15 μm, for example. The laser scanning speed is 3,000 mm/sec., for example. Namely, when laser beam is scanned at 20 μm per shot along a direction X, laser beam is irradiated at 150,000 shots per second.

In the following, an example of laser irradiation is described when a laser is irradiated under the above conditions.

In this example, first, a laser is irradiated at a first line, for example, along (0, 0)~(XX, 0), on the X-Y plane of an object to be irradiated. In particular, a laser is irradiated at the first irradiation spot (0, 0), and when the irradiation is finished, the laser is moved by unit moving amount (d12) toward (X2) and irradiated at the next irradiation spot (20, 0). Then, as shown by arrows in FIG. 6A, the laser is irradiated successively at each irradiation spot set along a direction X on the object by repeating laser irradiation and movement toward (X2). Accordingly, when the green laser is finished irradiating along the entire X direction of the object, the laser irradiation along the first line is completed.

Next, a laser is irradiated at a second line, for example along (0, 15)~(XX, 15), on the X-Y plane of the object. In particular, as shown by arrows in FIG. 6A, the green laser is returned to the original point of X coordinate from the last irradiation spot (XX, 0) on the first line, while the Y coordinate is moved toward (Y1) by unit moving amount (d13). Then, the same as the first line, the laser beam is scanned starting at the irradiation spot (0, 15) toward (X2). Accordingly, by irradiating successively along each line, the green laser is irradiated at the entire second surface (X-Y plane) of the object.

In the example shown here, a laser is scanned along a direction X which is perpendicular to a longitudinal direction (direction Y) of the conductive pattern. However, a laser may be scanned along a direction Y which is parallel to a longitudinal direction of the conductive pattern. Moreover, scanning is not limited to point irradiation. For example, using a cylindrical lens to produce linear light in direction X or Y, the linear light may be scanned in direction Y or X. Also, without using shading mask 1004, a laser may be irradiated only at the portions to be irradiated by halting laser irradiation where irradiation is not required. In addition, irradiation spots and a method for controlling laser intensity may be determined freely.

In the present embodiment, since copper foil 1001 (conductive film) is patterned by laser irradiation, a conductive pattern is formed without using a photolithographic technique. As a result, side etching, undercutting and the like are suppressed, and a conductive pattern with excellent electrical characteristics is considered to be obtained. In addition, it is effective in forming a fine pattern. For example, a fine pattern of L/S=10 μm/10 μm is formed at a high yield without using a highly clean room. Moreover, by using a green laser for the patterning, filler (10a) works as a stopper to suppress excessive removal of insulation layer 10 under copper foil 1001 while sufficient production efficiency is ensured. In the following, a description for the above is provided by referring to FIG. 8 and others.

Figure 8:
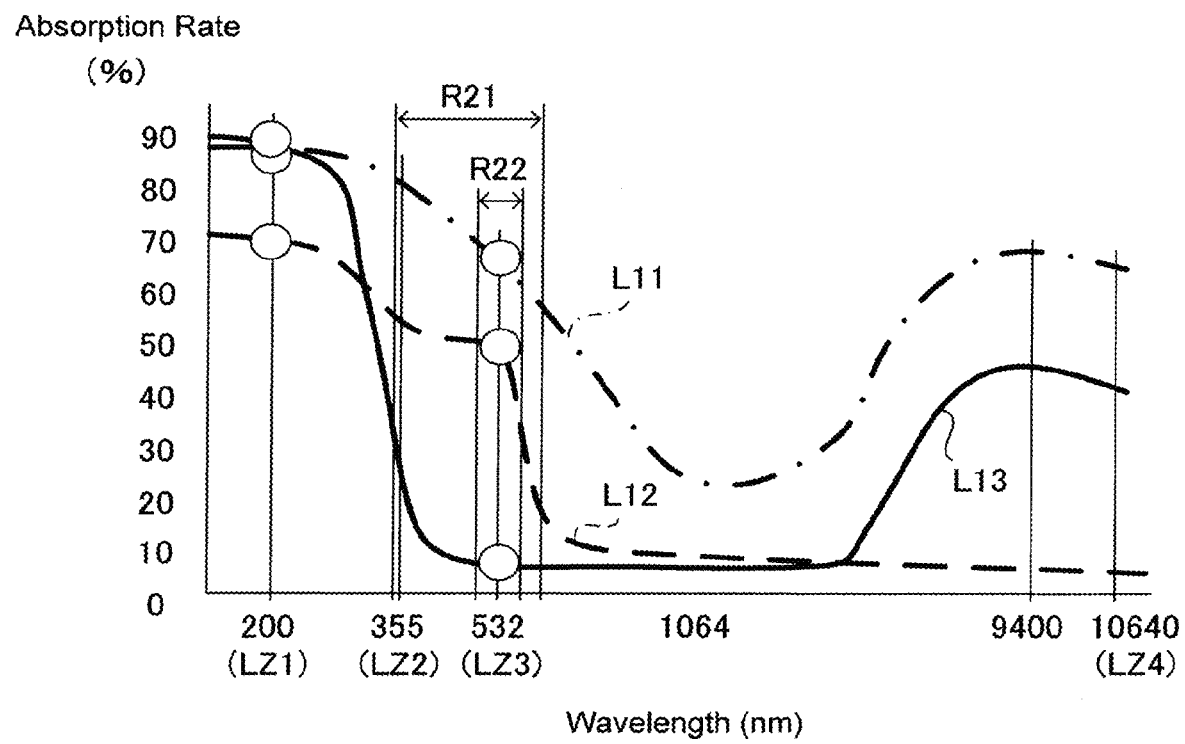
FIG. 8 is a graph showing relationships between laser wavelengths and absorption rates in each material.

FIG. 8 is a graph showing the relationship between a laser wavelength and absorption rates when laser beam is irradiated respectively at epoxy resin (line L11), copper (line L12) and silica (line L13). Here, if epoxy resin is replaced with other resins, or if silica is replaced with other inorganic fillers, substantially the same effects are achieved. First, laser beam (LZ3) with a wavelength of 532 nm (green laser) and laser beam (LZ4) with a wavelength of 10640 nm are compared. As the light source for laser beam (LZ4), a $CO_2$ laser may be used, for example.

Figure 9:
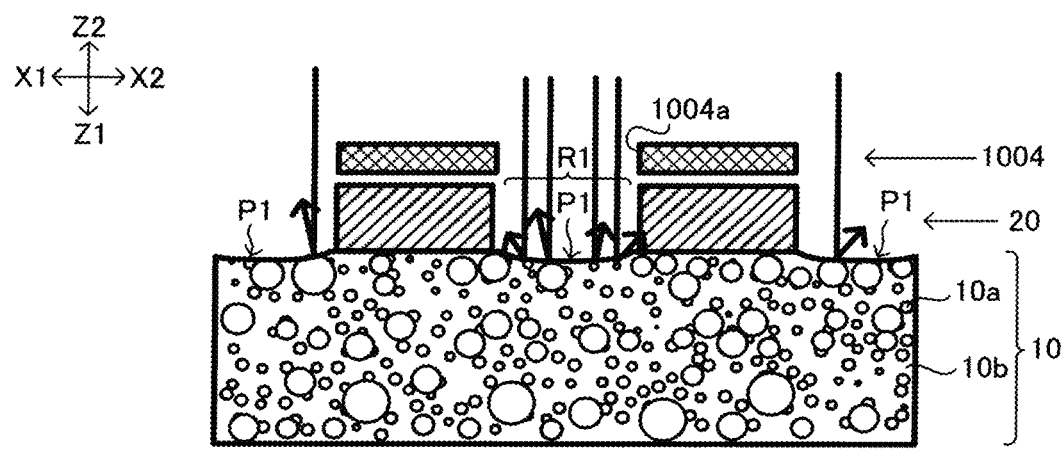
FIG. 9 is a view showing how filler functions as a stopper during a laser irradiation step.

As shown in FIG. 8, the absorption rate of laser beam (LZ4) is high in both epoxy resin (line L11) and silica (line L13); however, the absorption rate of laser beam (LZ3) is high in epoxy resin (line L11) and low in silica (line L13). Especially, in laser beam (LZ3), the absorption rate of silica (line L13) is kept at 20% or less, in particular at approximately 10%. Since insulation layer 10 contains resin (10b) (epoxy resin) as well as filler (10a) (a silica-type filler) in the present embodiment, when a green laser is irradiated at insulation layer 10, filler (10a) works as a stopper to suppress progress of the decomposition reaction (photochemical reaction) in insulation layer 10. Namely, as shown in FIG. 9, for example, filler (10a) reflects green laser to suppress excessive removal of insulation layer 10 from the irradiation spot. To use filler (10a) as a stopper, the absorption rate of laser beam in resin (10b) is preferred to be seven or more times the absorption rate of laser beam in filler (10a).

Also, the absorption rate in copper (line L12) is higher in laser beam (LZ3) than in laser beam (LZ4). When irradiating a laser to pattern copper foil 1001, the absorption rate of laser beam in copper is preferred to be higher to a certain degree. That is because removal of conductor (copper) becomes more efficient. However, if the absorption rate of laser beam in copper is too high, disadvantages such as excessive shaving of copper may occur. Thus, the absorption rate of laser beam in the material (copper) for conductive film is preferred to be in a certain range so that laser beam is appropriately absorbed in copper; in particular, a range of 30~65% is preferred. For that matter, since the absorption rate of green laser in copper is 50%, it is suitable for patterning a conductive layer.

Also, laser beam with a wavelength of 1064 nm or less decomposes the object primarily by a photochemical reaction, and laser beam with a wavelength of greater than 1064 nm decomposes the object primarily by a thermal reaction. If the two reactions are compared, energy efficiency is higher in a photochemical reaction, which uses beam as is, than in a thermal reaction, which uses beam by converting it to heat. Accordingly, a green laser is also excellent for energy efficiency. Furthermore, if non-thermal treatment is performed using the same green laser, but making the pulse width extremely short, for example, on the order of picoseconds or femtoseconds, energy efficiency is enhanced even more.

Laser beam (LZ1) with a wavelength of 200 nm, laser beam (LZ2) with a wavelength of 355 nm (UV laser) and laser beam (LZ3) with a wavelength of 532 nm (green laser) are compared. As the light source of laser beam (LZ1), an excimer laser may be used, for example. In addition, as laser beam (LZ2), the third harmonic of a YAG laser may be used, for example.

Those laser beams (LZ1~LZ3) are common in that they decompose the object primarily by photochemical reaction. However, regarding the absorption rates in epoxy resin (line L11), copper (line L12) and silica (line L13) respectively, laser beam (LZ1) has the highest, laser beam (LZ2) has the second highest, and laser beam (LZ3) has the lowest, as shown in FIG. 8. More specifically, absorption rates of laser beams (LZ2, LZ3) are listed in epoxy resin (line L11), copper (line L12) and silica (line L13) from the highest in that order. However, the absorption rates of laser beam (LZ1) are listed in epoxy resin (line L11), silica (line L13) and copper (line L12) from the highest in that order. Moreover, there is little difference in the absorption rates of laser beam (LZ1) in epoxy resin (line L11) and in silica (line L13). Therefore, if an excimer laser is used in the previously described laser processing, filler (10a) does not function as a stopper. On the other hand, if a green laser is used in the previously described laser processing, filler (10a) works as a stopper, and phenomena such as deep-cut epoxy resin seldom occur. Also, the ratio of the absorption rate in copper (line L12) to the absorption rate in silica (line L13) (copper/silica) is preferred to be approximately five to one or greater.

Considering the above, the laser beam to be used in laser irradiation for patterning copper foil 1001 is preferred to be a type which decomposes the object primarily by photochemical reaction, namely, laser beam with a wavelength of 1064 nm or shorter. Also, considering the efficiency of removing the conductor (copper), the absorption rate of laser beam in the material for conductive film (copper) should preferably be in the range of 30~60%. If the wavelength of laser beam is in the range of 350~600 nm (range R21), the absorption rate of the laser beam is in the range of 30~60%. Furthermore, using filler (10a) as a stopper and considering the efficiency and the like of removing the conductor, it is more preferable if the wavelength is in the range of 500~560 nm (range R22).

The light source may be a solid laser, a liquid laser or a gas laser. Specifically, a YAG laser, a YVO$_4$ laser, an argon ion laser or a copper vapor laser are preferable as a light source. For example, by using the second harmonic of a YAG laser or a YVO$_4$ laser, laser beam with a wavelength of 532 nm is obtained, and by using the third harmonic of a YAG laser or a YVO$_4$ laser, laser beam with a wavelength of 355 nm is obtained. Also, by using an argon ion laser, laser beam with a wavelength in the range of 488~515 nm is obtained, and by using a copper vapor laser, laser beam with a wavelength in the range of 511~578 nm is obtained. However, the light source is not limited to those, and it is preferred to select a type appropriate to the required wavelength of the laser beam.

The above patterning method using a laser is compared with a wet method using an etching solution. If a wet method is used, since a substantially isotropic processing is conducted instead of an anisotropic processing when a laser is used (in particular, primarily processing in directions Z), the conductor tends to be excessively removed due to side etching or the like. As a result, there is a concern that the wiring width becomes thinner than the required width. For that matter, if a laser is used, the line width is suppressed from thinning locally, fine patterns become easier to design, and impedance matching becomes easier to achieve. Furthermore, since the consequences of side etching are fewer, the smoothness in the side surfaces of the wiring improves.

In addition, as a wet method results in liquid waste, using a laser is preferred from an environmental point of view.

Figure 10A:
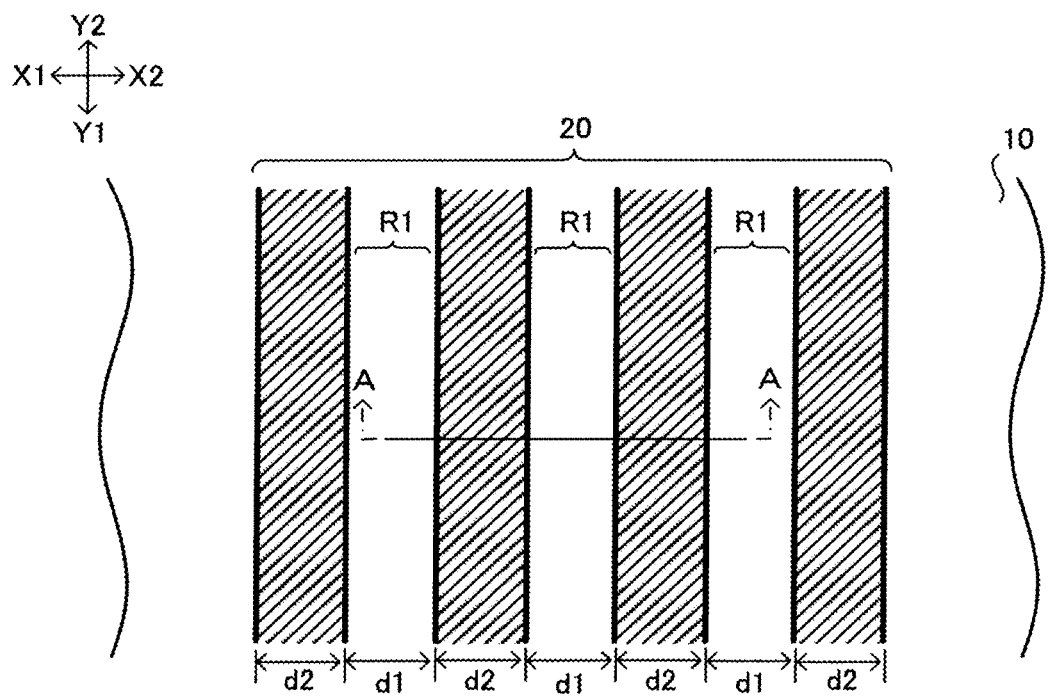
FIG. 10A is a view showing an example of the conductive pattern formed by a method for manufacturing a printed wiring board according to the first embodiment of the present invention.
Figure 10B:
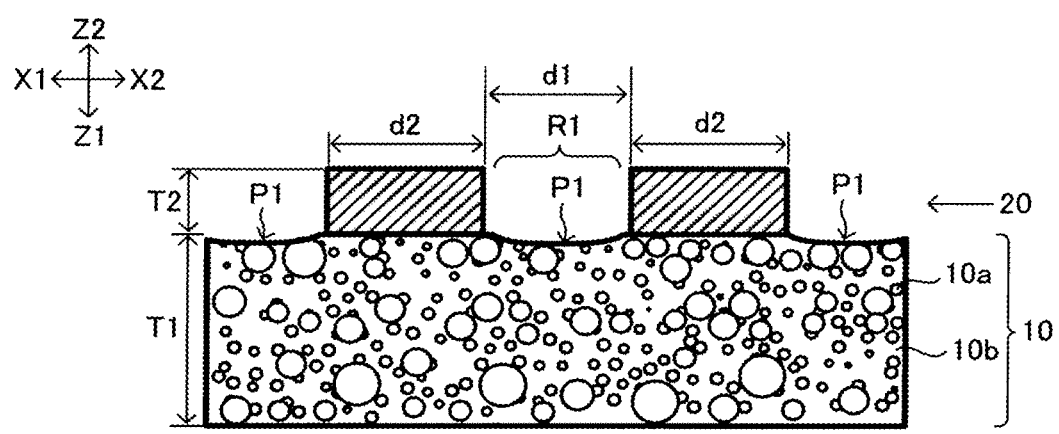
FIG. 10B is a cross-sectional view taken at the "A-A" line in FIG. 10A.
Figure 11:
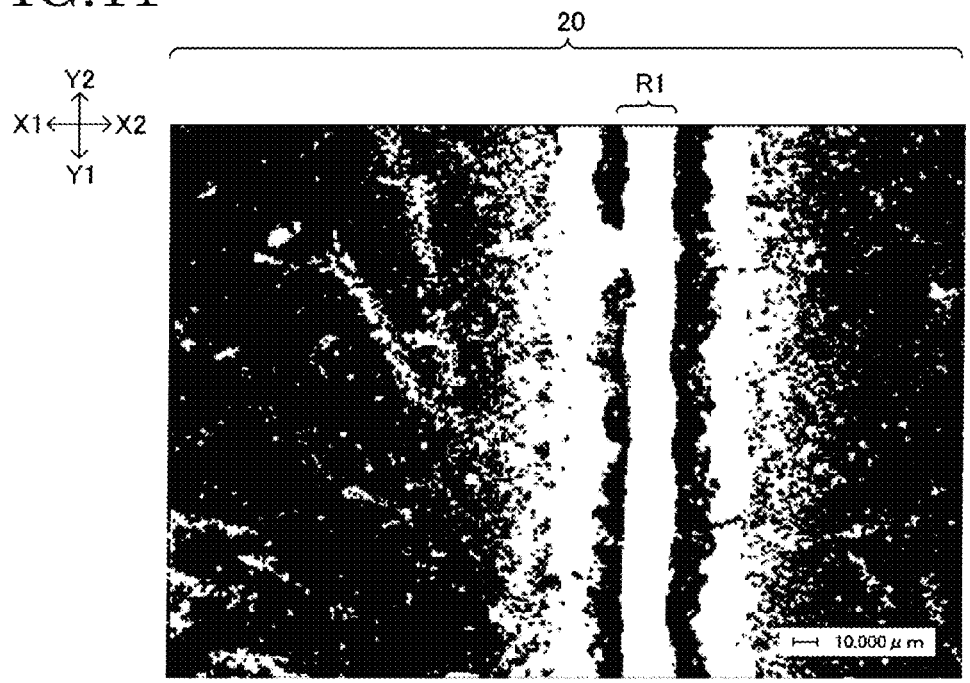
FIG. 11 is a view showing a monochrome image of an optical color photograph of a wiring board according to the first embodiment of the present invention.
Figure 12:
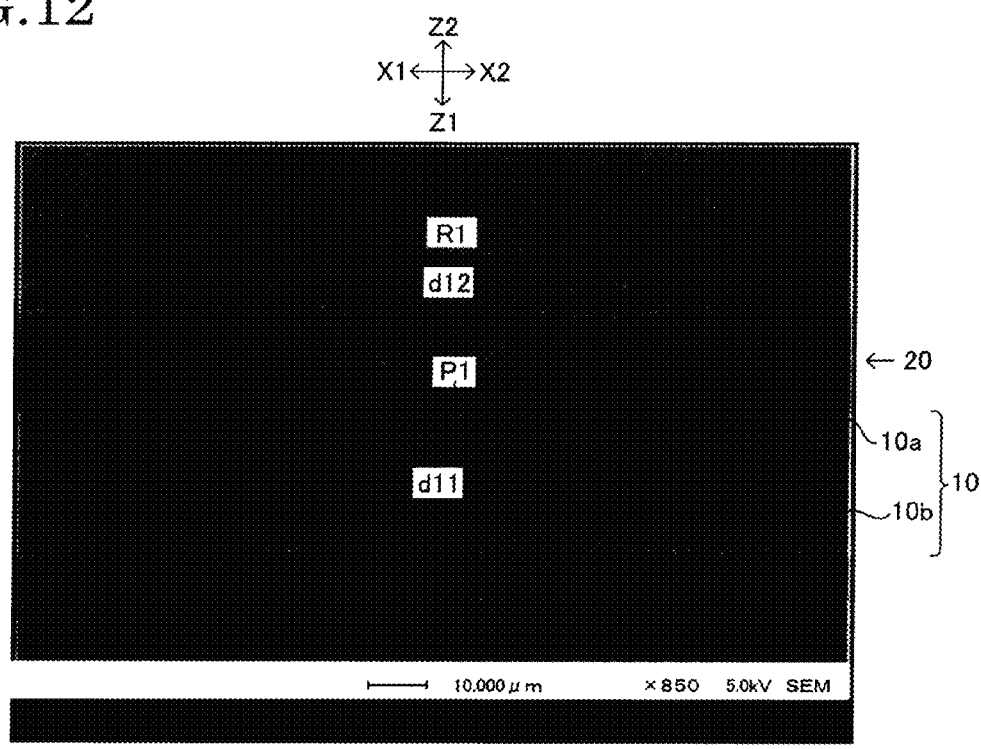
FIG. 12 is an SEM (scanning electron microscope) photograph of a wiring board according to the first embodiment of the present invention.

As a result of laser irradiation described above, copper foil 1001 (conductive film) is sectioned as shown in FIG. 10A and FIG. 10B (cross-sectional view taken at the "A-A" line in FIG. 10A), for example, and linear conductive pattern 20 is formed. FIGS. 11 and 12 are photographs showing conductive pattern 20 after the laser irradiation.

In space (R1) (groove) in conductive pattern 20 formed by irradiating a laser at portions of copper foil 1001 on insulation layer 10 (FIG. 6B), opening width (d11) on the side (Z1 side) of insulation layer 10 is smaller than opening width (d12) on the other side (Z2 side). Namely, space (R1) tapers with a diameter increasing from the side of insulation layer 10 toward the other side. Accordingly, voids seldom remain when the upper insulation layer (resin) flows into space (R1).

FIG. 13 is a table showing the results when a green laser with a pulse width on the order of nanoseconds and an average output of 5W is irradiated at insulation layers 10 containing four different inorganic fillers respectively. In those tests, epoxy resin was used for resin (10b), and SiO$_2$ powder (silica-type filler), CaCO$_3$ powder (calcium-carbonate filler), BaSO$_4$ powder (barium-sulfate filler) and Al(OH)$_3$ powder (aluminum-hydroxide filler) were used for filler (10a). In addition, regarding the SiO$_2$ powder, results are shown when a green laser was irradiated at insulation layers 10 respectively containing four different amounts of filler (10a). The scanning speed of laser beam was set at approximately 50 mm/sec. and the laser intensity was set at approximately 60 times that of the manufacturing process.

As shown in FIG. 13, when resin (10b) did not contain SiO$_2$ powder (approximately 0 wt. %), or resin (10b) containing SiO$_2$ powder at 15 wt. %, carbonization was observed on the surface of resin (10b) irradiated by laser. On the other hand, when resin (10b) contained SiO$_2$ powder at 30 wt. % or 50 wt. %, carbonization was not observed on either surface of resin (10b) irradiated by laser. Those results indicate that resin (10b) is suppressed from carbonization by adding filler (10a) at 30 wt. % or more to resin (10b). Also, if other inorganic fillers such as calcium-carbonate filler, barium-sulfate filler or aluminum hydroxide filler are used, substantially the same results are obtained.

The above method for patterning conductive pattern 20 by irradiating a laser is especially effective when forming fine patterns with high-density wiring. In particular, width (d1) (average value) of space (R1) between the conductors (such as conductive lines) forming conductive pattern 20 is 20 µm or less, for example, but width (d1) may also be set at 10 µm or less. On the other hand, width (d2) (average value) of the conductors (such as conductive lines) forming conductive pattern 20 is 20 µm or less, for example, but width (d2) may also be set at 10 µm or less. However, widths (d1, d2) are not limited to the above, and may be determined freely (see later-described FIGS. 26A, 26B).

When irradiating a laser in the present embodiment, not only is copper foil 1001 (conductive film) removed, but the surface of insulation layer 10 under copper foil 1001 (FIG. 6B) is also shaved. Accordingly, resin residue on the surface of insulation layer 10 is removed while recess (P1) is formed on the surface of insulation layer 10. However, recess (P1) is not always required to be formed (see later-described FIG. 29).

In step (S 15) of FIG. 2, upper insulation layers (such as an interlayer insulation layer, solder resist or the like) are formed on insulation layer 10. In doing so, wiring board 100 is completed as previously shown in FIG. 1A or 1B. In the obtained wiring board 100, adjacent conductors in conductive pattern 20 are insulated from each other. Namely, using the method for manufacturing a printed wiring board according to the present embodiment, a conductive pattern is formed without hampering insulation reliability between conductors.

Second Embodiment

Figure 14:
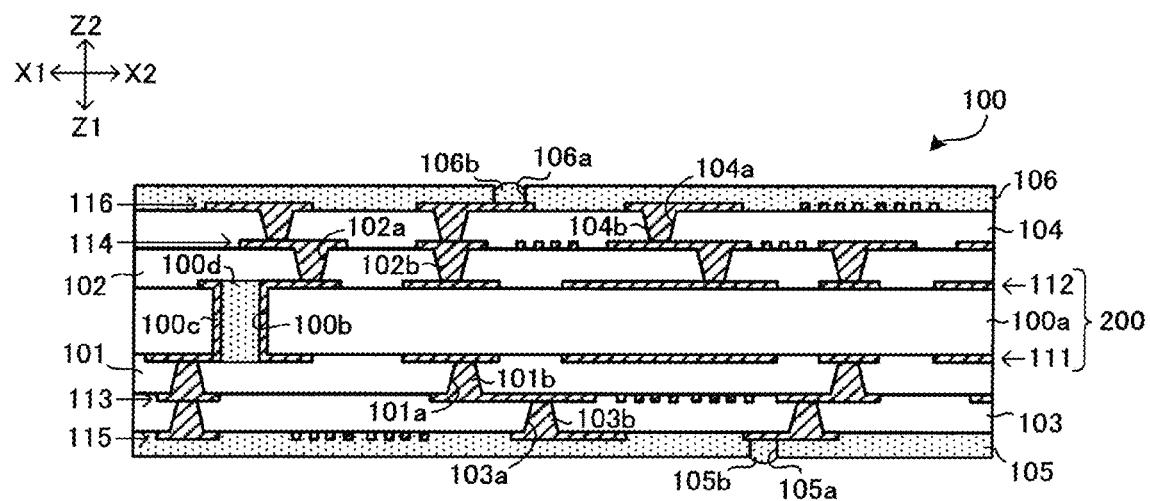
FIG. 14 is a view showing an example of the printed wiring board manufactured by a method for manufacturing a printed wiring board according to the second embodiment of the present invention.

Wiring board 100 manufactured in the present embodiment is a multilayer printed wiring board (double-sided rigid wiring board) as shown in FIG. 14, for example.

Wiring board 100 has substrate 200 (core substrate), insulation layers (101~104) (interlayer insulation layers), solder resists (105, 106), conductive patterns (113~116), through-hole conductor (100c), via conductors (101b~104b), solder resists (105, 106) and external connection terminals (105b, 106b). Substrate 200 has insulation layer (100a) and conductive patterns (111, 112). Through hole (100b) is formed in substrate 200. Through-hole conductor (100c) is formed on the side surface of through hole (100b), inside of which is filled with, for example, insulator (100d) flown from insulation layers (101, 102) on the first-surface side and second-surface side respectively. Opening portions (105a, 106a) are formed in solder resists (105, 106). External connection terminals (105b, 106b) are formed in opening portions (105a, 106a) of solder resists (105, 106). External connection terminals (105b, 106b) are made of solder bumps, for example.

Figure 15:
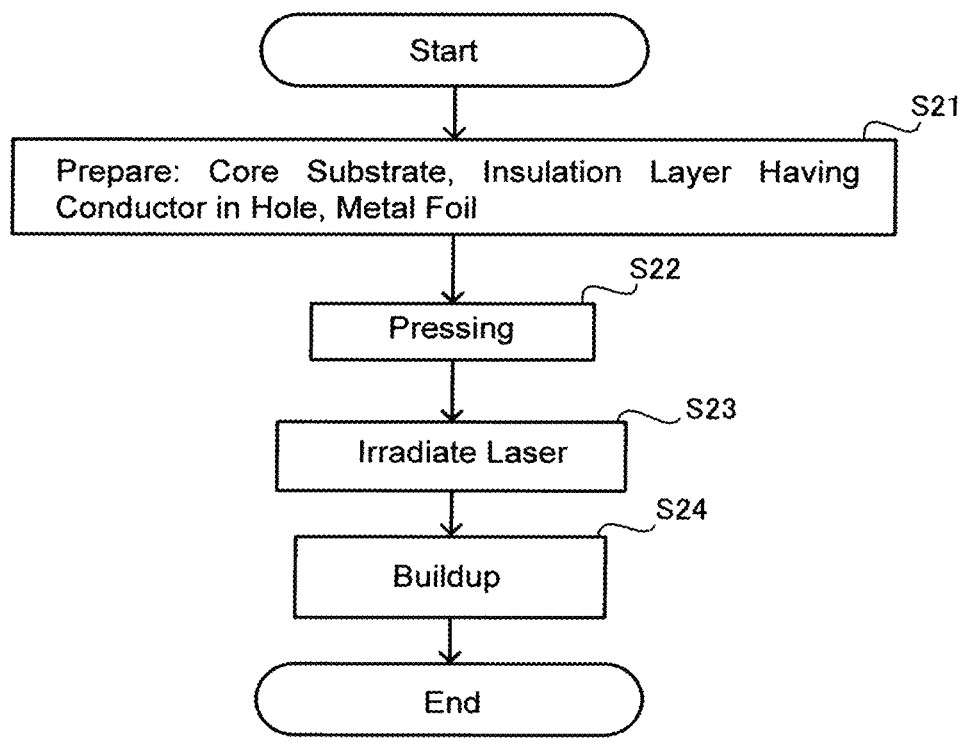
FIG. 15 is a flowchart showing a method for manufacturing a printed wiring board according to the second embodiment of the present invention.

The above wiring board 100 is manufactured by a method shown in FIG. 15, for example.

In step (S21), core substrate (substrate 200), insulation layers (insulation layers 101, 102) having conductor in their holes, and metal foils (copper foils 2005, 2006) are prepared (see later-described FIG. 17A).

Substrate 200 is manufactured (prepared) by a method shown in FIGS. 16A~16D, for example.

Figure 16A:
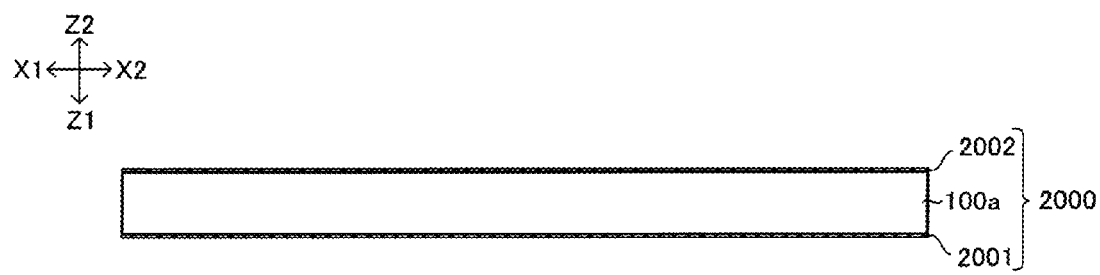
FIG. 16A is a view to illustrate a first step for manufacturing a core substrate.

As shown in FIG. 16A, double-sided copper-clad laminate 2000 (starting material) is prepared. Double-sided copper-clad laminate 2000 has insulation layer (100a) and copper foils (2001, 2002). Copper foil 2001 is formed on the first surface of insulation layer (100a), and copper foil 2002 is formed on the second surface of insulation layer (100a). The material for insulation layer (100a) is epoxy resin with reinforcing material such as glass fiber, for example.

Figure 16B:
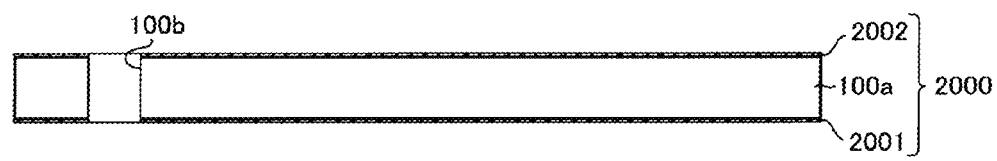
FIG. 16B is a view to illustrate a second step for manufacturing a core substrate.

As shown in FIG. 16B, through hole (100b) is formed in double-sided copper-clad laminate 2000 using a laser, for example. Through hole (100b) penetrates through double-sided copper-clad laminate 2000. Then, desmearing and soft etching are performed if required.

Figure 16C:
FIG. 16C is a view to illustrate a third step for manufacturing a core substrate.

As shown in FIG. 16C, plating 2003 is formed on both surfaces of insulation layer (100a) and the side surface of through hole (100b) by copper panel plating (through-hole plating and plating on the entire surface). Plating 2003 is double-layered with electroless plating and electrolytic plating, for example. However, such a double-layer structure is not always required.

Figure 16D:
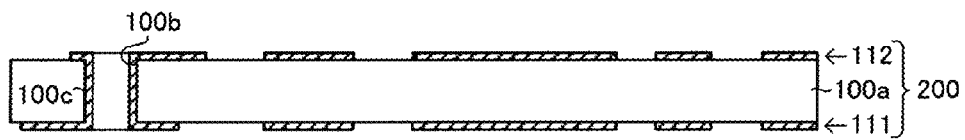
FIG. 16D is a view to illustrate a fourth step for manufacturing a core substrate.

As shown in FIG. 16D, conductors on both surfaces of insulation layer (100a) are patterned by lithographic techniques, for example. In doing so, conductive patterns (111, 112) are formed on the first surface and the second surface of insulation layer (100a) respectively. As a result, substrate 200 is completed.

Figure 17A:
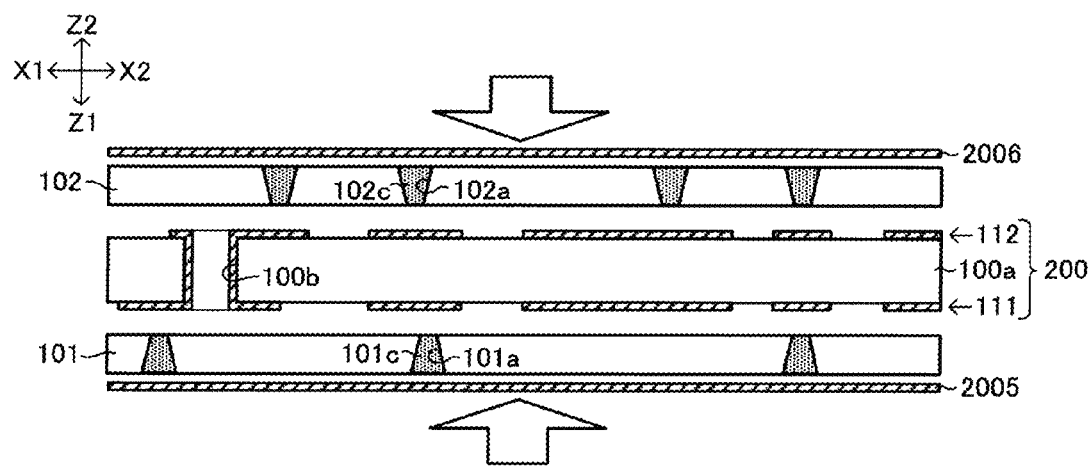
FIG. 17A is a view to illustrate a step for pressing first layers.

In addition to the above, insulation layers (101, 102) and copper foils (2005, 2006) are separately prepared as shown in FIG. 17A. The thickness of copper, foils (2005, 2006) is 12 for example. The material, thickness and so forth of insulation layers (101, 102) are the same as those for insulation layer 10 of the above-described first embodiment. Namely, insulation layers (101, 102) are also insulative resin layers containing inorganic filler at 30 wt. % or more. However, at this stage, insulation layers (101, 102) are prepreg (semi-cured adhesive sheet).

Here, holes (101a) are formed in insulation layer 101 and conductors (101c) are formed in holes (101a). Holes (102a) are formed in insulation layer 102 and conductors (102c) are formed in holes (102a). Conductors (101c, 102c) are made of conductive paste, for example. Conductive paste is made by blending conductive fine particles in a viscous binder at a certain consistency. A binder is resin or the like which can bind particles. Conductive paste is distinguished from plating.

Holes (101a, 102a) are formed in insulation layers (101, 102) respectively using a laser, for example. Also, conductors (101c, 102c) (conductive paste) are filled in holes (101a, 102a) respectively by printing, for example.

In step (S22) of FIG. 15, pressing is performed.

Substrate 200, insulation layers (101, 102) and copper foils (2005, 2006) are positioned as shown in FIG. 17A, for example. In particular, insulation layer 101 is positioned on the first-surface side of substrate 200 and insulation layer 102 is positioned on the second-surface side of substrate 200. Furthermore, copper foil 2005 is positioned on the first-surface side of insulation layer 101 and copper foil 2006 is positioned on the second-surface side of insulation layer 102.

Substrate 200 and others positioned as shown in FIG. 17A are pressed. Accordingly, pressure is exerted from the outside (copper foils 2005, 2006) toward the inside (substrate 200). Pressure is exerted while adding heat, for example. Through such pressing, resin (insulator 100d) is squeezed from the surrounding insulation layers (insulation layers 101, 102), and insulators (100d) are filled in through holes (100b) (see later-described FIG. 17B). In addition, through the above heating, prepreg (insulation layers 101, 102) is cured and adhered to the adjacent members. The above pressing and heating treatment may be conducted by dividing the treatment into multiple procedures. Also, heating and pressing may be conducted separately, but if conducted simultaneously, it would be more efficient. After thermal pressing, another heating may be conducted separately for integration.

Figure 17B:
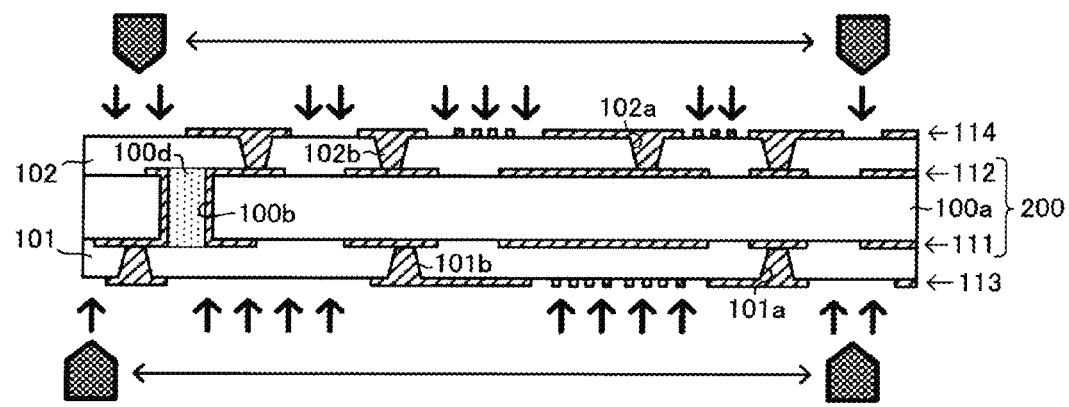
FIG. 17B is a view to illustrate a step for irradiating a laser at first layers.

In step (S23) of FIG. 15, as shown in FIG. 17B, for example, a green laser is irradiated at copper foils (2005, 2006) so that copper foils (2005, 2006) are sectioned to form conductive patterns (113, 114). The same as the first embodiment, this laser irradiation is performed on the entire surface of the object while a shading mask is placed. However, the laser irradiation is not limited to such; for example, without using a shading mask, a laser may be selectively irradiated only at the portions to be irradiated by halting laser irradiation where irradiation is not required.

In step (S24) of FIG. 15, a buildup section is formed on the laminate where above conductive patterns (113, 114) are formed.

Figure 18A:
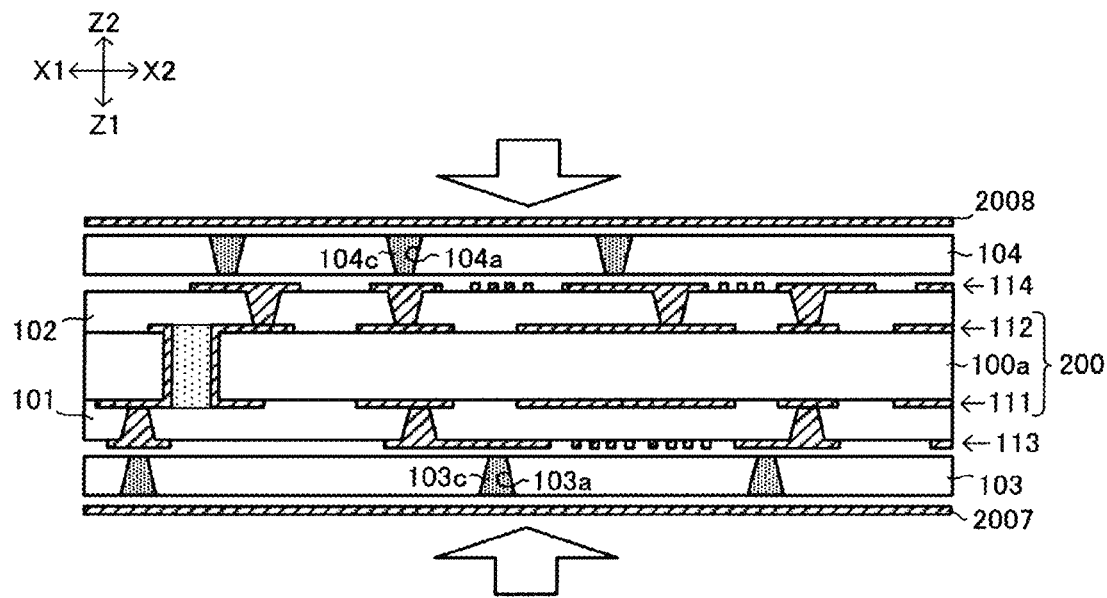
FIG. 18A is a view to illustrate a step for pressing second layers.

For example, as shown in FIG. 18A, insulation layer 103 and copper foil 200 are positioned on the first-surface side of the laminate, and insulation layer 104 and copper foil 2008 are positioned on the second-surface side of the laminate. The thickness of copper foils (2007, 2008) is 12 µm, for example. The material, thickness and so forth of insulation layers (103, 104) are the same as those for insulation layer 10 of the above described first embodiment. Namely, insulation layers (103, 104) are also insulative resin layers containing inorganic filler at 30 wt. % or more. However, at this stage, insulation layers (103, 104) are prepreg (semi-cured adhesive sheet).

Here, holes (103*a*) are formed in insulation layer 103 and conductors (103*c*) are formed in holes (103*a*). Holes (104*a*) are formed in insulation layer 104 and conductors (104*c*) are formed in holes (104*a*). Conductors (103*c*, 104*c*) are made of conductive paste, for example.

The above laminate is thermal pressed. Accordingly, the prepreg (insulation layers 103, 104) is cured, and insulation layers (103, 104) and copper foils (2007, 2008) become integrated with the laminate.

Figure 18B:
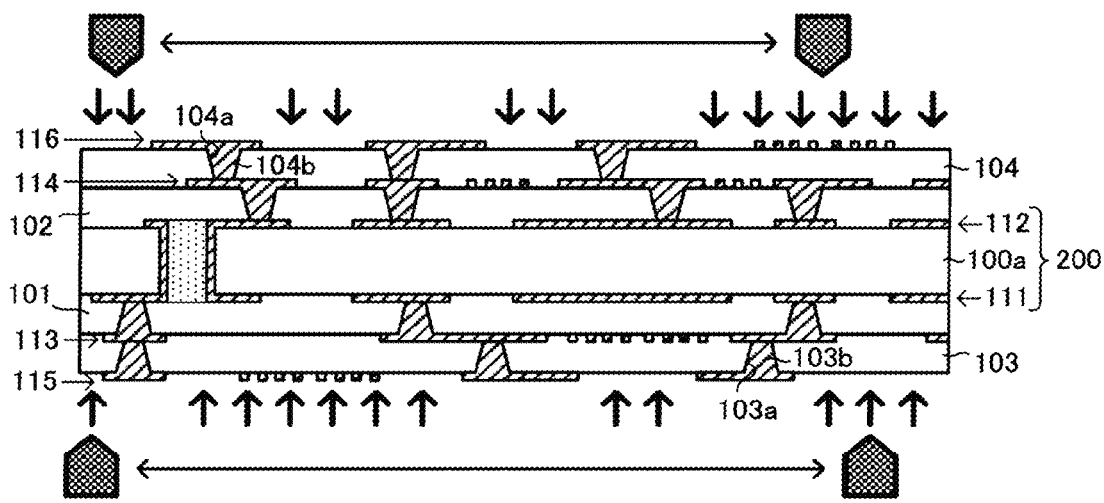
FIG. 18B is a view to illustrate a step for irradiating a laser at second layers.

As shown in FIG. 18B, for example, by irradiating a green laser at copper foils (2007, 2008), copper foils (2007, 2008) are sectioned and conductive patterns (115, 116) are formed. The laser irradiation is performed on the entire surface of the object with a shading mask placed thereon, the same as in the first embodiment, for example. However, laser irradiation is not limited to such.

By screen printing, spray coating, roll coating, lamination or the like, for example, solder resists (105, 106) having opening portions (105*a*, 106*a*) are formed. Then, by printing solder paste and reflowing, for example, external connection terminals (105*b*, 106*b*) are formed in opening portions (105*a*, 106*a*) of solder resists (105, 106). Accordingly, wiring board 100 may be connected to another wiring board, an electronic component may be mounted on wiring board 100 and so forth through external connection terminals (105*b*, 106*b*). In addition, external processing, warping correction, conductivity inspection, exterior inspection, final inspection and so forth are performed if required. Through the above procedures, wiring board 100 of the present embodiment (FIG. 14) is completed.

The same or substantially the same effects as those in the first embodiment are achieved by the method for manufacturing a printed wiring board according to the present embodiment. Therefore, a printed wiring board having excellent electrical characteristics is manufactured, while sufficient production efficiency is maintained. Moreover, in the present embodiment, conductors for connecting layers (conductors 101 c, etc.) are formed in advance with conductive paste and the conductors and their lower layer are pressed to be connected. Thus, the manufacturing process is simplified compared with a method in which conductors (101*c*) and the like are formed by plating.
Third Embodiment The same as in the second embodiment, wiring board 100 manufactured in the present embodiment is a multilayer printed wiring board (double-sided rigid wiring board) as shown in FIG. 14, for example.

Figure 19:
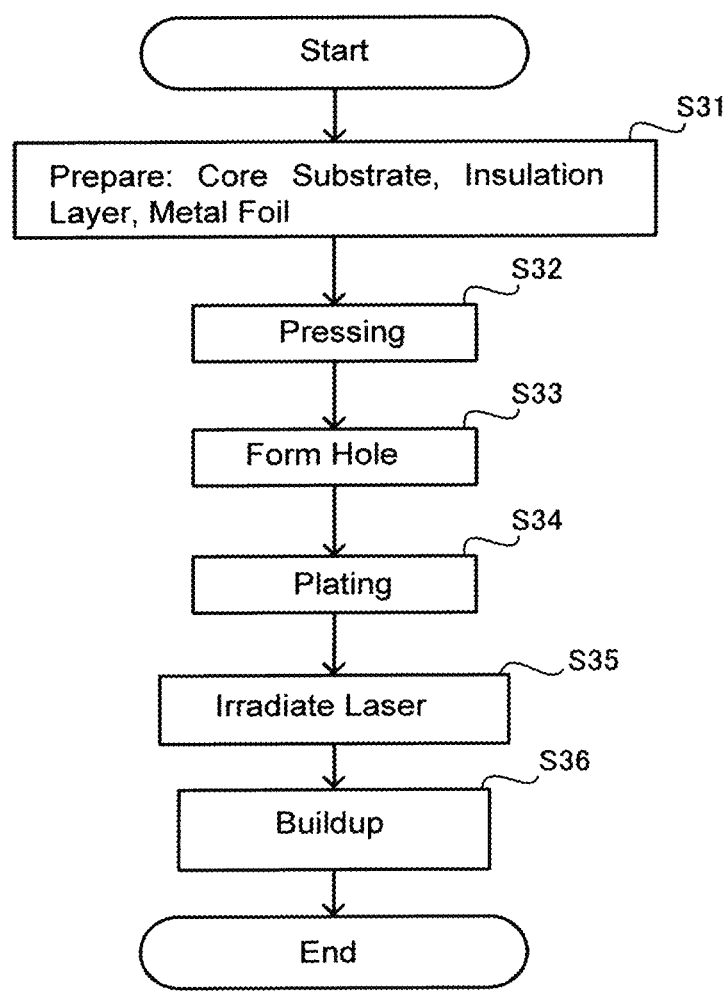
FIG. 19 is a flowchart showing a method for manufacturing a printed wiring board according to the third embodiment of the present invention.

However, in the present embodiment, wiring board 100 is manufactured by the method shown in FIG. 19, for example.

Figure 20A:
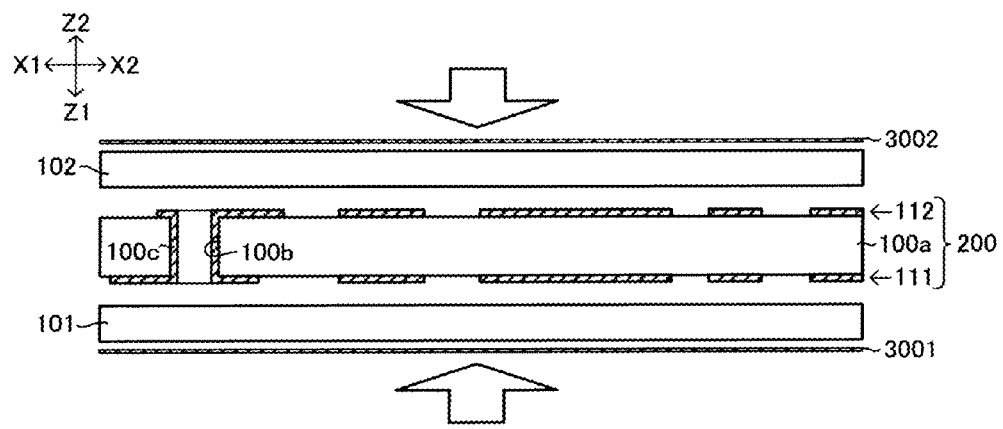
FIG. 20A is a view to illustrate a pressing step.

In step (S31), core substrate (substrate 200), insulation layers (insulation layers 101, 102) and metal foils (copper foils 3001, 3002) are prepared (FIG. 20A). The thickness of copper foils (3001, 3002) is 3 µm, for example. The material, thickness and so forth of insulation layers (101, 102) are the same as those of insulation layer 10 of the above-described first embodiment. Namely, insulation layers (101, 102) are also insulative resin layers containing inorganic filler at 30 wt. % or more. However, at this stage, insulation layers (101, 102) are prepreg (semi-cured adhesive sheet).

Pressing is conducted in step (S32) of FIG. 19.

Substrate 200, insulation layers (101, 102) and copper foils (3001, 3002) are positioned as shown in FIG. 20A, for example, and then thermal pressed the same as described in step (S22) of FIG. 15. In doing so, the prepreg (insulation layers 101, 102) is cured, and insulation layers (101, 102) and copper foils (3001, 3002) are integrated with substrate 200.

Figure 20B:
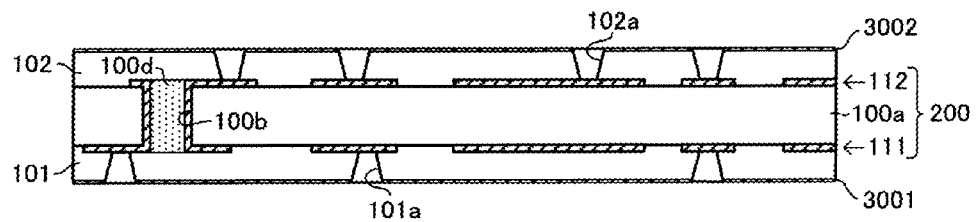
FIG. 20B is a view to illustrate a step for forming holes.

Holes are formed in step (S33) of FIG. 19. Specifically, holes (101*a*, 102*a*) are formed in insulation layers (101, 102) using a laser, for example, as shown in FIG. 20B. Then, desmearing and soft etching are performed if required.

Figure 20C:
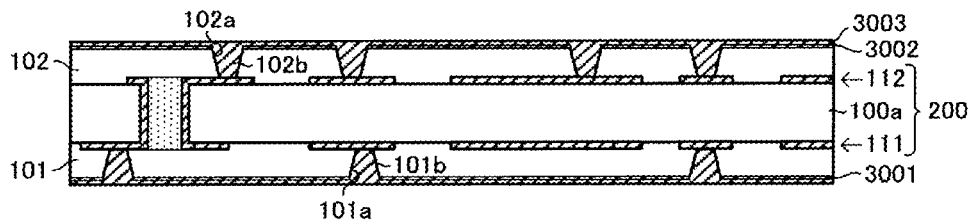
FIG. 20C is a view to illustrate a plating step.

Plating is performed in step (S34) of FIG. 19. Specifically, as shown in FIG. 20C, plating 3003 is formed on insulation layers (101, 102) and inside holes (101*a*, 102*a*) through copper panel plating. Plating 3003 is double-layered with electroless plating and electrolytic plating, for example. However, a double-layer structure is not always required.

In step (S35) of FIG. 19, the same as described in step (S23) of FIG. 15, a green laser is irradiated at the conductor on insulation layers (101, 102) so that predetermined portions of the conductor are sectioned. Accordingly, conductive patterns (113, 114) are formed. The laser is irradiated on the entire surface of the object using a shading mask, for example, the same as in the first embodiment. However, the irradiation method is not limited to such.

In step (S36) of FIG. 19, a buildup process is carried out on the laminate where the above conductive patterns (113, 114) are formed, the same as described in step (S24) of FIG. 15. Accordingly, wiring board 100 of the present embodiment (FIG. 14) is completed.

The same or substantially the same effects as those in the first embodiment are achieved by the method for manufacturing a printed wiring board according to the present embodiment. Therefore, a printed wiring board having excellent electrical characteristics is manufactured, while sufficient production efficiency is maintained. Moreover, since conductors for connecting layers (conductor 101*c*, etc.) are formed with plating in the present embodiment, lower resistance is achieved compared with a case in which conductors (101*c*) and the like are formed with conductive paste.
Fourth Embodiment The same as in the second embodiment, wiring board 100 manufactured in the present embodiment is a multilayer printed wiring board (double-sided rigid wiring board) as shown in FIG. 14, for example.

Figure 21:
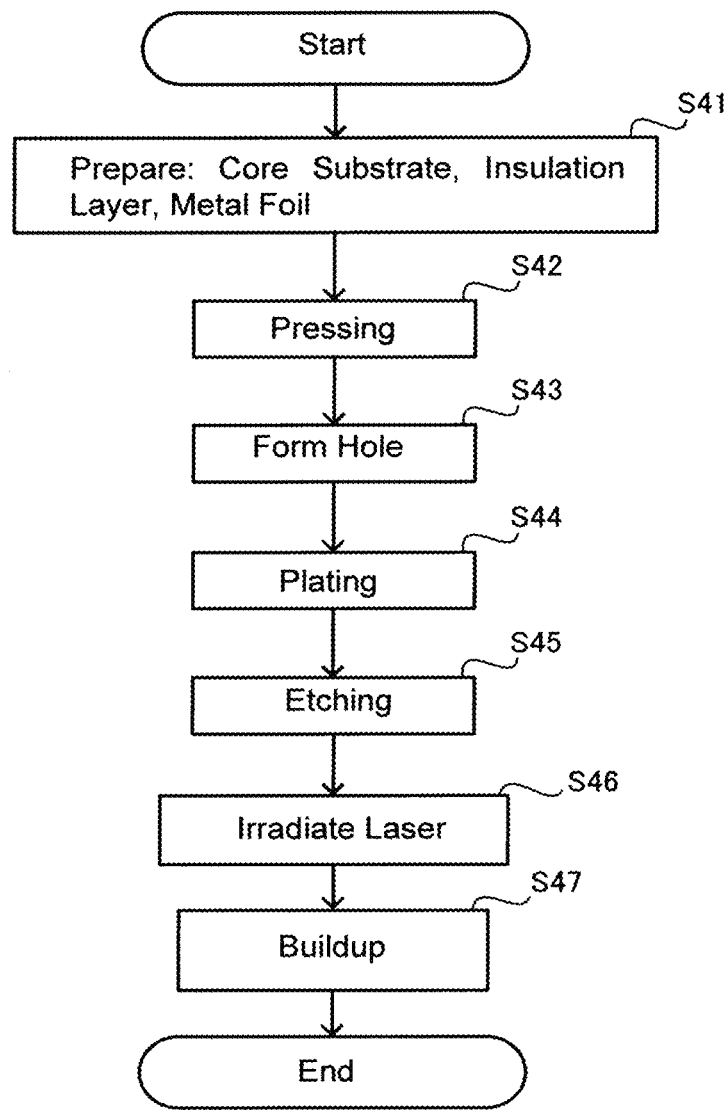
FIG. 21 is a flowchart showing a method for manufacturing a printed wiring board according to the fourth embodiment of the present invention.

However, in the present embodiment, wiring board 100 is manufactured by the method shown in FIG. 21, for example.

In steps (S41)~(S44), the core substrate, insulation layers and metal foils are prepared the same as in steps (S31)~(S34) of FIG. 19, and pressing, boring holes and plating are carried out. Accordingly, a substrate as shown previously in FIG. 20C is obtained.

Figure 22A:
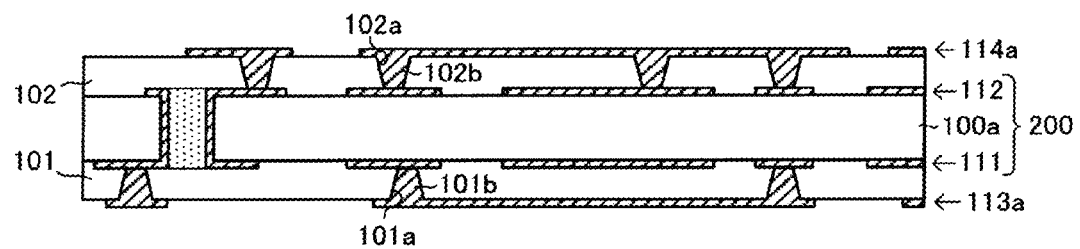
FIG. 22A is a view to illustrate an etching step.
Figure 22B:
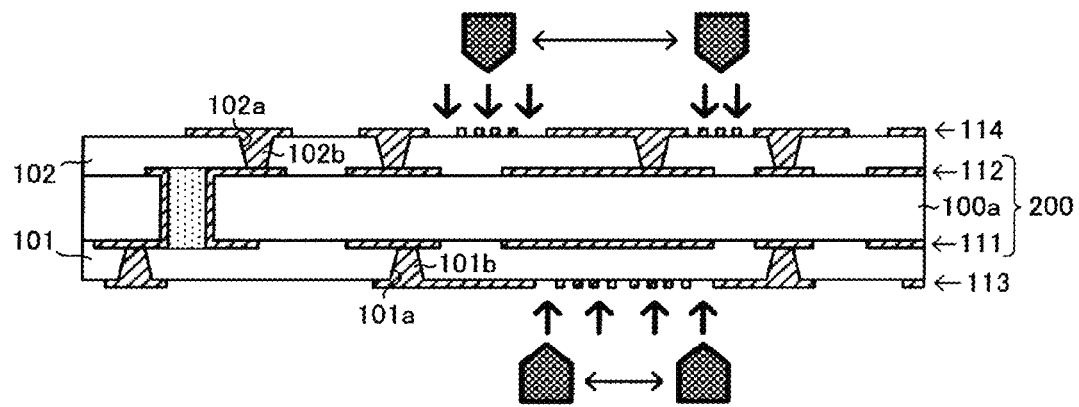
FIG. 22B is a view to illustrate a step for irradiating a laser.

In step (S45) of FIG. 21, the conductors on insulation layers (101, 102) are partially etched. In particular, as shown in FIG. 22A, for example, wider conductive patterns (113*a*, 114*a*) are formed using a lithographic technique (preliminary treatment, lamination, exposure to light, development, etching, removing film, inner-layer inspection and so forth). Conductive patterns (113*a*, 114*a*) are wider than conductive patterns (113, 114) (FIG. 14).

In step (S46) of FIG. 21, by irradiating a green laser at the conductors of conductive patterns (113*a*, 114*a*), the conductors of conductive patterns (113*a*, 114*a*) are sectioned, and finer conductive patterns (113, 114) are formed. The laser is irradiated using a shading mask on the entire surface of the object the same as in the first embodiment, for example. However, the irradiation method is not limited to such; for example, without using a shading mask, a laser may be selectively irradiated only at the portions to be irradiated by halting laser irradiation where irradiation is not required.

In step (S47) of FIG. 21, a buildup section is formed the same as described in step (S24) of FIG. 15 on the laminate where above conductive patterns (113, 114) are formed. Accordingly, wiring board 100 of the present embodiment (FIG. 14) is completed.

The same or substantially the same effects as those in the first embodiment are achieved by the method for manufacturing a printed wiring board according to the present embodiment. Therefore, a printed wiring board having excellent electrical characteristics is manufactured, while sufficient production efficiency is maintained. Moreover, since the conductive patterns are made finer in stages in the present embodiment, even more precise processing is considered to be achieved.

Fifth Embodiment

How to section conductors on insulative resin layers by irradiating laser beam at the conductors is described in the first through fourth embodiments. In the present embodiment, how to make the width of conductors thinner using laser beam is described.

Figure 23:
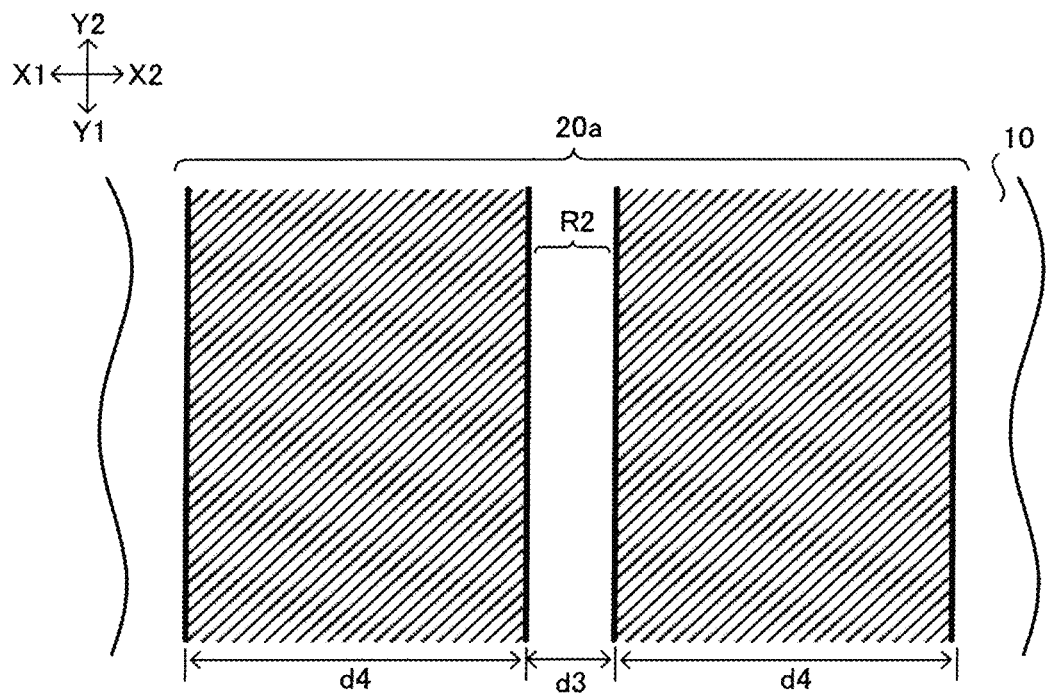
FIG. 23 is a view showing a conductive pattern before it is made finer by a method for manufacturing a printed wiring board according to the fifth embodiment of the present invention.

As shown in FIG. 23, a substrate (starting material) having insulation layer 10 and conductive pattern (20a) (wider conductive pattern) is prepared. Conductive pattern (20a) is formed on insulation layer 10. The material, thickness and so forth of insulation layer 10 are the same as those in the above-described first embodiment. Namely, insulation layer 10 is also an insulative resin layer containing inorganic filler at 30 wt. % or more. Conductive pattern (20a) has a linear conductive pattern, for example. The width (average value) of space (R2) (groove) between conductors formed in conductive pattern (20a) is width (d3). The width (average value) of conductive lines formed in conductive pattern (20a) is width (d4).

Figure 24:
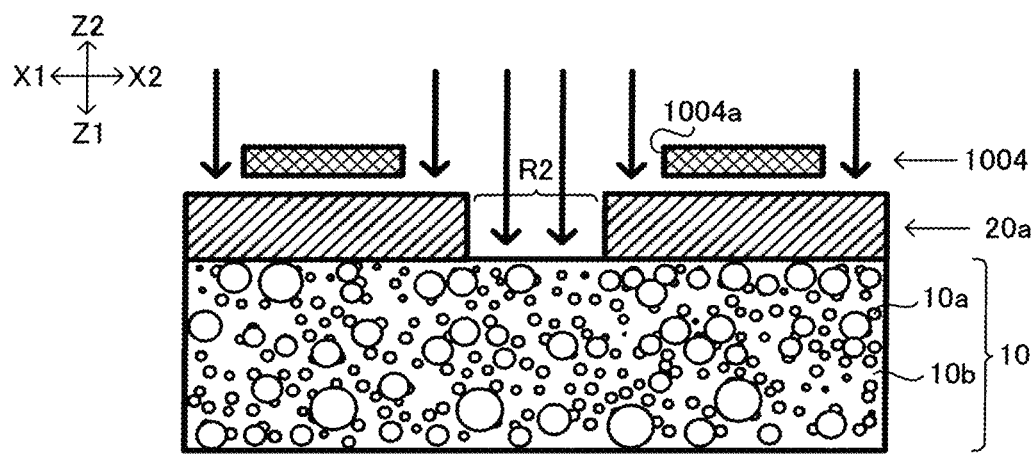
FIG. 24 is a view to illustrate a step for irradiating a laser.

As shown in FIG. 24, by irradiating a green laser at conductors of conductive pattern (20a), the width of the conductors is narrowed and conductive pattern 20 with a finer conductive pattern is formed. While using shading mask 1004 having opening portions (1004a), the laser is irradiated on the entire surface of the object the same as in the first embodiment. During the laser irradiation, shading mask 1004 placed on a conductor, which is required to remain (narrower and finer wiring than the wiring of conductive pattern 20a), protects the conductor. However, the irradiation method is not limited to such; for example, without using shading mask 1004, a laser may be selectively irradiated only at the portions to be irradiated by halting laser irradiation where irradiation is not required.

Figure 25A:
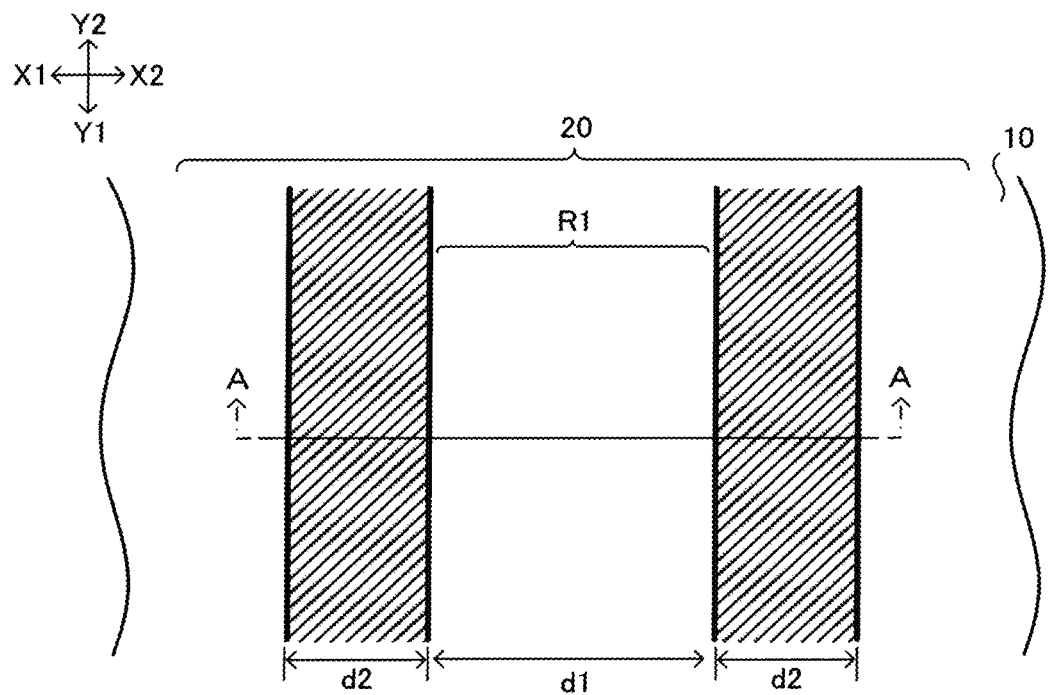
FIG. 25A is a view showing an example of a conductive pattern after it is made finer.
Figure 25B:
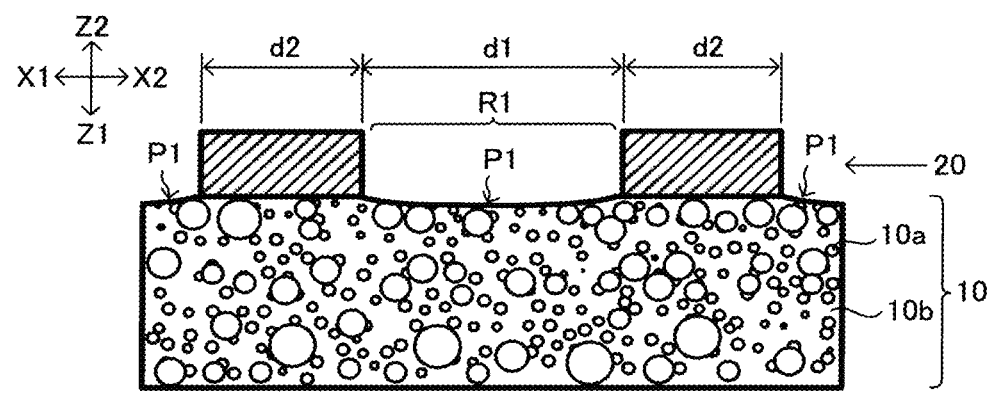
FIG. 25B is a cross-sectional view taken at the "A-A" line in FIG. 25A.

By the above laser irradiation, linear conductive pattern 20 finer than conductive pattern (20a) is formed as shown in FIG. 25A and FIG. 25B (a cross-sectional view taken at the "A-A" line in FIG. 25A), for example. Width (d1) (average value) of space (R1) (groove) between conductors formed in conductive pattern 20 is greater than width (d3) (FIG. 23). In addition, width (d2) (average value) of conductive lines formed in conductive pattern 20 is smaller than width (d4) (FIG. 23). The present embodiment shows an example in which the surface of insulation layer 10 is shaved by irradiating a green laser the same as in the first embodiment. In doing so, resin residue on the surface of insulation layer 10 is removed, while recess (P1) is formed on the surface of insulation layer 10.

The same or substantially the same effects as those in the first embodiment are achieved by the method for manufacturing a printed wiring board according to the present embodiment. Moreover, since the conductive patterns are made finer in stages in the present embodiment, even more precise processing is considered to be achieved. Also, the method according to the present embodiment may be applied to the methods for manufacturing a printed wiring board according to the second through fourth embodiments (for example, step (S23) of FIG. 15, step (S35) of FIG. 19, step (S46) of FIG. 21 and so forth). Therefore, a printed wiring board having excellent electrical characteristics is manufactured, while sufficient production efficiency is maintained.

So far, printed wiring boards and their manufacturing methods according to the embodiments of the present invention have been described. However, the present invention is not limited to the above embodiments.

Figure 26A:
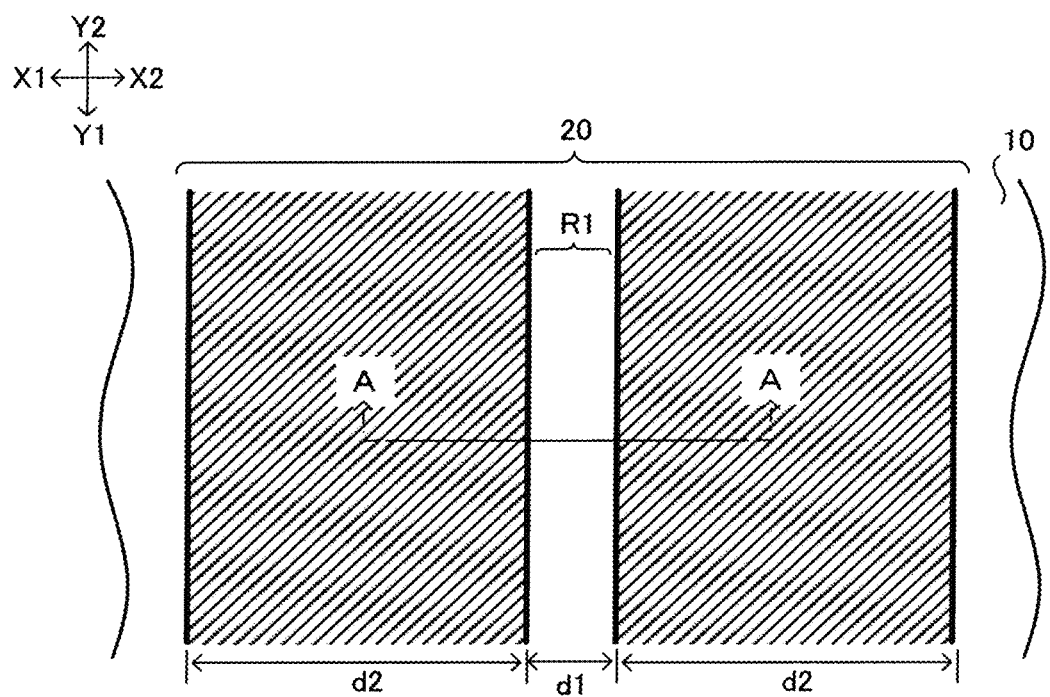
FIG. 26A is a view showing a first alternative example of a conductive pattern.
Figure 26B:
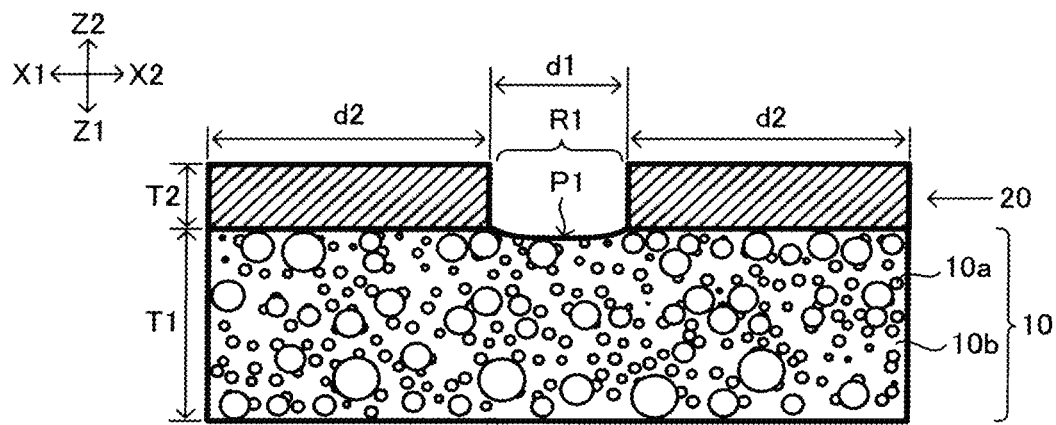
FIG. 26B is a cross-sectional view taken at the "A-A" line in FIG. 26A.

Width (d1) of space (R1) and width (d2) of the conductors in conductive pattern 20 may be determined freely. For example, as shown in FIG. 26A and FIG. 26B (a cross-sectional view taken at the "A-A" line of FIG. 26A), conductive pattern 20 may also be a pattern having smaller width (d1) of space (R1) (highly integrated pattern), or a pattern having greater width (d2) of conductive lines (wider conductive lines).

Conductive pattern 20 is not limited to a linear pattern, and any other pattern may be employed.

Figure 27:
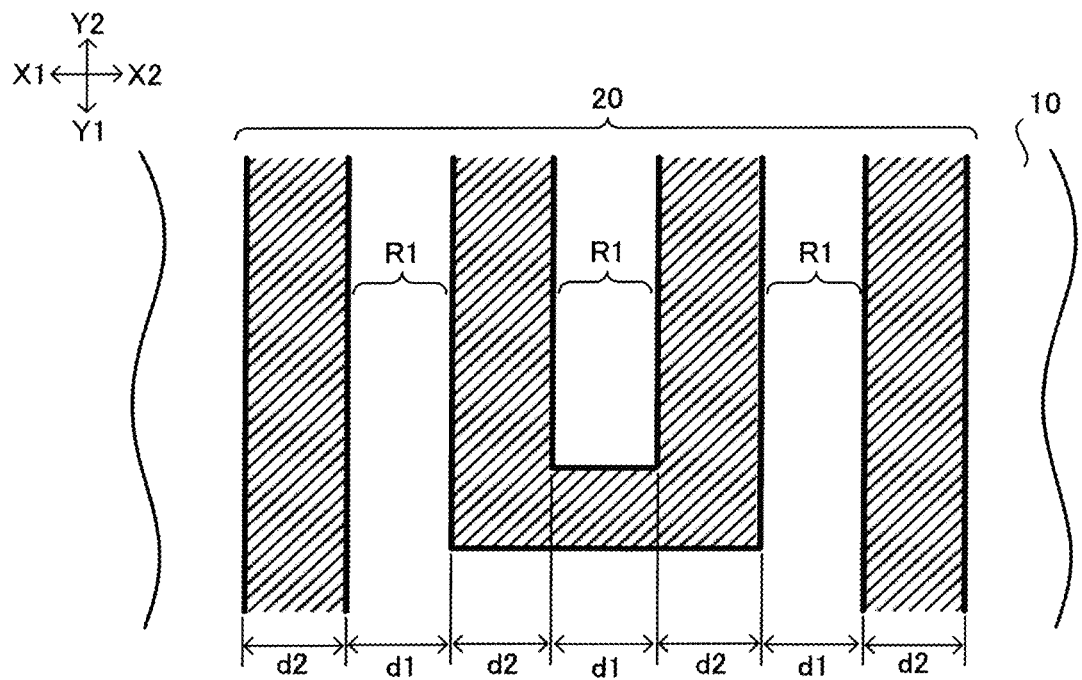
FIG. 27 is a view showing a second alternative example of a conductive pattern.

For example, as shown in FIG. 27 (a plan view corresponding to FIG. 10A), conductive pattern 20 may be a U-shaped conductive pattern.

Figure 28:
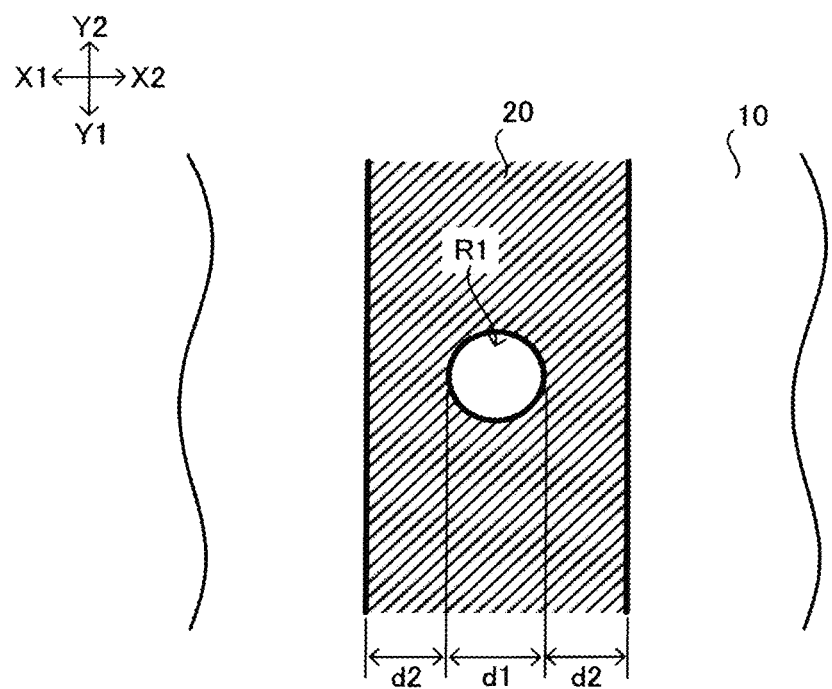
FIG. 28 is a view showing a third alternative example of a conductive pattern.

Alternatively, as shown in FIG. 28 (a plan view corresponding to FIG. 10A), space (R1) in conductive pattern 20 may be a hole.

Figure 29:
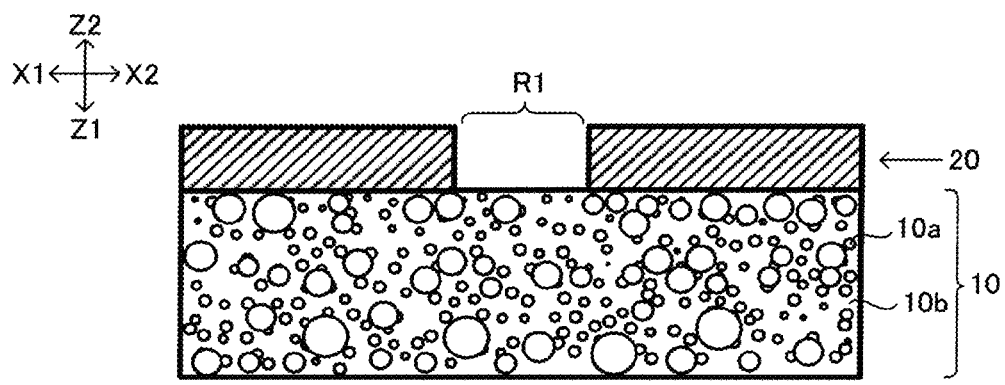
FIG. 29 is a view showing an example in which no recess is formed in the portion irradiated by laser beam.

For example, as shown in FIG. 29, the surface of insulation layer 10 under copper foil 1001 removed by laser irradiation may be a flat surface without recess (P1) (FIG. 10B).

Figure 30:
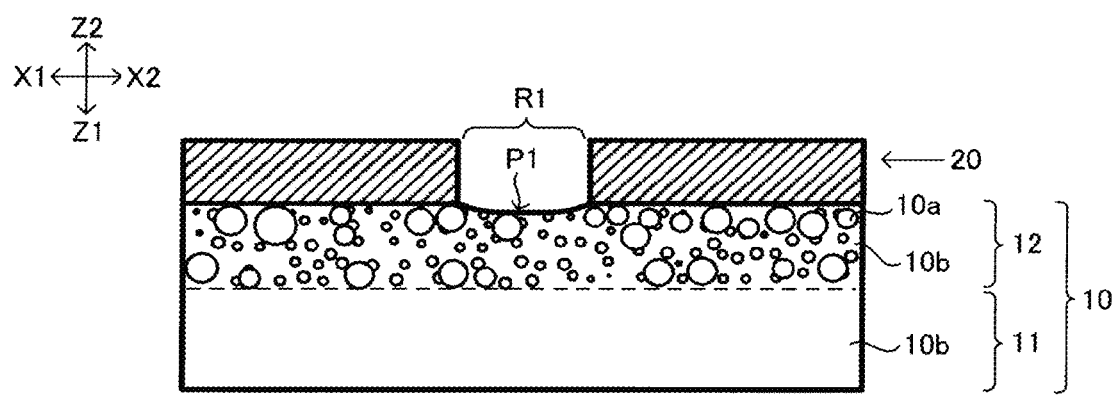
FIG. 30 is a view showing an example of the wiring board having a filler layer in the surface-layer portion of an insulation layer.

It is not always required to disperse filler (10a) in substantially the entire insulation layer 10. For example, as shown in FIG. 30, insulation layer 10 may be formed with, for example, first layer 11 (resin layer) without filler (10a) and second layer 12 (filler layer) containing filler (10a). In such an example, first layer 11 is primarily made of resin (10b) and second layer 12 is primarily made of filler (10a) and resin (10b). Second layer 12 is formed on first layer 11. Alternatively, multiple resin layers and multiple filler layers may be alternately laminated.

Conductors other than copper may be used for the material of conductive pattern 20. As long as substantially the same relationships shown in FIG. 8 are obtained, substantially the same effects as those described above are achieved.

Regarding other factors, the structure of wiring board 100, as well as type, performance, dimensions, quality, shape, number of layers, positioning and so forth of the elements of such a structure, may be modified freely within a scope that does not deviate from the gist of the present invention.

For example, basically, the wiring board to be manufactured may be selected freely as long as it is a wiring board having a conductive pattern on an insulation layer made of resin. Thus, it may be a rigid wiring board or a flexible wiring board. Also, it may be a double-sided wiring board or a single-sided wiring board. The number of layers of conductive patterns and insulation layers may also be determined freely.

The method for manufacturing wiring board 100 is not limited to the contents described in the above embodiments, and the order and contents may be modified freely within a scope that does not deviate from the gist of the present invention. Also, depending on usage requirements or the like, some steps may be omitted.

Each of the above embodiments and each modified example may be combined freely. It is preferred to select an appropriate combination according to usage requirements and the like.

For example, the method according to the fifth embodiment may be used by combining it with the method according to the first embodiment. Namely, by irradiating laser beam at conductors on an insulative resin layer, a portion may be sectioned while the width of the conductor in another portion is made thinner.

In addition, if space (R1) in conductive pattern 20 is a hole (see FIG. 28), for example, the tapered structure or the like shown previously in FIG. 12 may also be employed.

A method for manufacturing a printed wiring board according to one aspect of the present invention includes forming an insulative resin layer containing inorganic filler at 30 wt. % or more; forming a conductor on the insulative resin layer; and forming a conductive pattern on the insulative resin layer by irradiating laser beam on the conductor so that the conductor is sectioned or the width of the conductor becomes narrower.

A printed wiring board according to another aspect of the present invention has an insulative resin layer containing inorganic filler at 30 wt. % or more; and a conductive pattern formed by forming a conductor on the insulative resin layer and by irradiating laser beam at the conductor.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a printed wiring board, comprising:
   forming an insulative resin layer comprising a resin and an inorganic filler, the inorganic filler being in an amount of 30 wt. % or more of the insulative resin layer;
   forming a conductor layer comprising a conductive material and having a conductor on the insulative resin layer;
   irradiating a laser beam upon the conductor of the conductor layer such that the conductor is sectioned or a width of the conductor is narrowed; and
   forming a conductive pattern on the insulative resin layer.

2. The method for manufacturing a printed wiring board according to claim 1, wherein the conductive material of the conductor layer on the insulative resin is made of copper.

3. The method for manufacturing a printed wiring board according to claim 2, wherein the laser beam has an absorption rate with respect to copper in a range of 30~65%.

4. The method for manufacturing a printed wiring board according to claim 1, wherein the inorganic filler is a silica filler.

5. The method for manufacturing a printed wiring board according to claim 4, wherein the laser beam has an absorption rate of 20% or less with respect to silica.

6. The method for manufacturing a printed wiring board according to claim 1, wherein the laser beam has an absorption rate with respect to the conductor layer on the insulative resin layer which is greater than an absorption rate of the laser beam with respect to the inorganic filler.

7. The method for manufacturing a printed wiring board according to claim 1, wherein the inorganic filler includes a spherical filler in a sufficient amount such that the inorganic filler stops penetration of the laser beam.

8. The method for manufacturing a printed wiring board according to claim 1, wherein the conductor layer on the insulative resin layer has a thickness which is in a range of 5~20 μm.

9. The method for manufacturing a printed wiring board according to claim 1, wherein the conductive material of the conductor layer on the insulative resin layer is a metal foil.

10. The method for manufacturing a printed wiring board according to claim 1, wherein the conductor layer on the insulative resin layer includes an electroless plated film and an electrolytic plated film.

11. The method for manufacturing a printed wiring board according to claim 1, wherein the laser beam has a wavelength in a range of 350~600 nm.

12. The method for manufacturing a printed wiring board according to claim 1, wherein the laser beam is irradiated from a light source which is one of a YAG laser, a $YVO_4$ laser, an argon ion laser, a semiconductor laser and a copper vapor laser.

13. The method for manufacturing a printed wiring board according to claim 12, wherein the laser beam is a second harmonic of a YAG laser or a $YVO_4$ laser.

14. The method for manufacturing a printed wiring board according to claim 1, wherein the conductive pattern has a space whose width is 20 μm or less.

15. The method for manufacturing a printed wiring board according to claim 1, wherein the conductive pattern has a conductor whose width is 20 μm or less.

16. The method for manufacturing a printed wiring board according to claim 1, wherein the inorganic filler includes a spherical filler in an amount of 50 wt. % or more of the inorganic filler.

17. The method for manufacturing a printed wiring board according to claim 1, wherein the inorganic filler has an average particle diameter between 0.5 μm and 10 μm.

18. The method for manufacturing a printed wiring board according to claim 1, wherein the inorganic filler is in an amount of 50 wt. % or more of the insulative resin layer.

19. The method for manufacturing a printed wiring board according to claim 1, wherein the resin of the insulative resin layer is a thermosetting resin.

20. The method for manufacturing a printed wiring board according to claim 1, wherein the irradiating of the laser beam comprises shaving a surface of the insulative resin layer by the laser beam.

21. The method for manufacturing a printed wiring board according to claim 1, further comprising forming an insulation layer on the insulative resin layer and on the conductive pattern.

22. The method for manufacturing a printed wiring board according to claim 1, wherein the laser beam is irradiated upon the conductor of the conductor layer such that the conductor is sectioned or a width of the conductor is narrowed and the conductive pattern is formed on the insulative resin layer in a same process.

* * * * *